(12) United States Patent
Pitcher et al.

(10) Patent No.: US 6,585,870 B1
(45) Date of Patent: Jul. 1, 2003

(54) PHYSICAL VAPOR DEPOSITION TARGETS HAVING CRYSTALLOGRAPHIC ORIENTATIONS

(75) Inventors: Philip George Pitcher, Spokane, WA (US); Zhihua Yan, Veradle, WA (US)

(73) Assignee: Honeywell International Inc., Morristown, NJ (US)

( * ) Notice: Subject to any disclaimer, the term of this patent is extended or adjusted under 35 U.S.C. 154(b) by 28 days.

(21) Appl. No.: 09/671,681

(22) Filed: Sep. 28, 2000

Related U.S. Application Data

(63) Continuation-in-part of application No. 09/559,600, filed on Apr. 28, 2000.

(51) Int. Cl.⁷ ............................................. C23C 14/34
(52) U.S. Cl. .............................. 204/298.13; 204/298.12
(58) Field of Search ......................... 204/298.12, 298.13

(56) References Cited

U.S. PATENT DOCUMENTS

| | | | |
|---|---|---|---|
| 4,166,784 A | 9/1979 | Chapin et al. ............ 204/192.3 |
| 4,842,706 A * | 6/1989 | Fukasawa et al. ...... 204/298.13 |
| 4,902,583 A * | 2/1990 | Brucker et al. .............. 428/665 |
| 4,995,958 A | 2/1991 | Anderson et al. ......... 204/298.2 |
| 5,126,029 A | 6/1992 | Tomer et al. ........... 204/192.12 |
| 5,270,255 A | 12/1993 | Wong .......................... 438/643 |
| 5,298,137 A | 3/1994 | Marshall, III .......... 204/192.12 |
| 5,328,585 A | 7/1994 | Stevenson et al. ........ 204/298.2 |
| 5,358,616 A | 10/1994 | Ward ..................... 204/192.15 |
| 5,382,344 A | 1/1995 | Hosokawa et al. ....... 204/298.2 |
| 5,417,833 A | 5/1995 | Harra et al. .............. 204/298.2 |
| 5,556,525 A | 9/1996 | Krivokapic et al. ... 204/192.12 |
| 5,565,071 A | 10/1996 | Demaray et al. ....... 204/192.12 |
| 5,672,255 A | 9/1997 | Hamada et al. ........ 204/298.07 |
| 5,766,380 A * | 6/1998 | Lo et al. ................. 204/298.13 |
| 5,798,027 A | 8/1998 | Lefebvre et al. ....... 204/192.26 |
| 5,855,744 A | 1/1999 | Halsey et al. .......... 204/192.12 |
| 5,873,989 A | 2/1999 | Hughes et al. ........... 204/298.2 |
| 5,876,576 A | 3/1999 | Fu ............................ 204/298.2 |
| 5,879,523 A | 3/1999 | Wang et al. ............. 204/298.11 |
| 5,897,752 A | 4/1999 | Hong et al. .............. 204/192.2 |
| 5,952,086 A | 9/1999 | Onishi et al. ................ 428/220 |
| 5,988,262 A | 11/1999 | Hasegawa et al. .......... 164/484 |
| 5,993,621 A | 11/1999 | Liu ........................ 204/298.12 |
| 6,030,511 A * | 2/2000 | Shinmura .............. 204/298.13 |
| 6,039,848 A | 3/2000 | Moslehi et al. ........ 204/192.12 |
| 6,042,706 A | 3/2000 | Fu ......................... 204/298.12 |
| 6,045,634 A | 4/2000 | Annavarapu ................ 148/671 |
| 6,080,285 A * | 6/2000 | Liu et al. ............... 204/192.12 |
| 6,090,246 A | 7/2000 | Liephart ................. 204/192.13 |
| 6,136,693 A | 10/2000 | Chan et al. ............ 204/192.15 |
| 6,153,315 A | 11/2000 | Yamakoski et al. .... 204/192.15 |
| 6,238,494 B1 * | 5/2001 | Segal .................... 204/298.13 |

FOREIGN PATENT DOCUMENTS

| | | | |
|---|---|---|---|
| GB | 2331768 | 6/1999 | |
| JP | 63035769 A * | 2/1988 | ........... C23C/14/34 |
| JP | 211758 | 1/1990 | |
| JP | 03002369 A * | 1/1991 | ........... C23C/14/34 |

(List continued on next page.)

OTHER PUBLICATIONS

Abstract of JP 10008244 A (Isamu et al.)*
Wehner, Gottfried K., "Sputtering of Metal Single Crystals by Ion Bombardment", Journal of Applied Physics, vol. 26, No. 8, p. 1056–1057, Aug. 1955.

(List continued on next page.)

*Primary Examiner*—Patrick Ryan
*Assistant Examiner*—Gregg Cantelmo
(74) *Attorney, Agent, or Firm*—Wells St. John P.S.

(57) ABSTRACT

A process and device for making sputtered films with a linear scanning magnetron, wherein sputtering employs directionally emitting targets and "ballistic" transport to achieve controlled angular dispersion of incident particles with respect to the normal of the substrate. Sputter films made by this process can exhibit a high degree of step coverage over sub-micron, high aspect ratio substrate features and can fill high aspect ratio substrate features, for example, channels or vias.

4 Claims, 39 Drawing Sheets

FOREIGN PATENT DOCUMENTS

| | | | |
|---|---|---|---|
| JP | 4173967 | | 6/1992 |
| JP | 04 308 081 A | * | 10/1992 |
| JP | 4314862 | | 11/1992 |
| JP | 0551774 | | 3/1993 |
| JP | 5198390 | | 8/1993 |
| JP | 5234893 | | 9/1993 |
| JP | 5263235 | | 10/1993 |
| JP | 5287519 | | 11/1993 |
| JP | 5295535 | | 11/1993 |
| JP | 5335277 | | 12/1993 |
| JP | 6116721 | | 4/1994 |
| JP | 6212420 | | 8/1994 |
| JP | 6275602 | | 9/1994 |
| JP | 0729896 | | 1/1995 |
| JP | 7233473 | | 9/1995 |
| JP | 07 268 616 A | * | 10/1995 |
| JP | 0878189 | | 3/1996 |
| JP | 8260140 | | 10/1996 |
| JP | 8269712 | | 10/1996 |
| JP | 10102236 | | 4/1998 |
| JP | 10102246 | | 4/1998 |
| JP | 1180948 | | 3/1999 |
| JP | 11 229 130 A | * | 8/1999 |
| WO | 9848444 | | 10/1998 |
| WO | 9907913 | | 2/1999 |

OTHER PUBLICATIONS

Tsuge, H. et al, "Angular distribution of sputtered atoms from polycrystalline metal targets", Journal of Applied Physics, vol. 52, No. 7, p. 4391–4395, Jul. 1981.

Wehner, Gottfried K., "Controlled Sputtering of Metals by Low–Energy Hg Ions", Physical Review, vol. 102, No. 3, pp. 690–704, May 1957.

Wehner, G. K. et al, "Angular Distribution of Sputtered Material", Journal of Applied Physics, vol. 31, No. 1, p. 177–179, Jan. 1960.

Vossen, John L. et al, *Thin Film Processes,* Academic Press, Inc., p. 142–143 (1978).

Ji, Yi, Fabrication and Characterization of Magnetic Materials, Johns Hopkins University, p. 1–6 (on or before Jul. 14, 1999).

Wasa, Kiyotaka, et al, *Handbook of Sputter Deposition Technology,* Noyes Publications p. 57–61, 1992.

Rossnagel, S. M., "Directional and ionized physical vapor deposition for microelectronics applications", J. Vac. Sci. Technol. B, vol. 16, No. 5, p. 2585–2608, Sep.–Oct. 1998.

Vacuum Solutions, "Sputtering advance reaches the target", Sep./Oct. 2000, pp. 23–25.

JL Vossen, Thin Film Processes:, 1978, pp. 46–51.

WM Posadowski, Sustained self sputtering of different materials using dc magnetron, 1995, pp. 1017–1020.

* cited by examiner

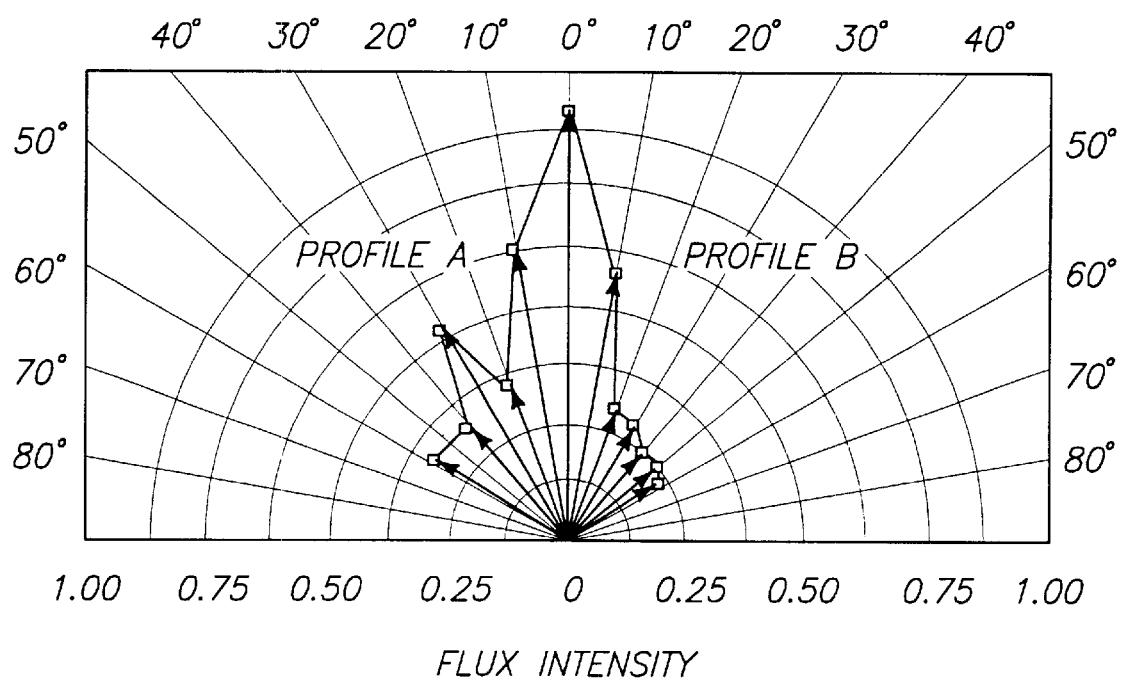

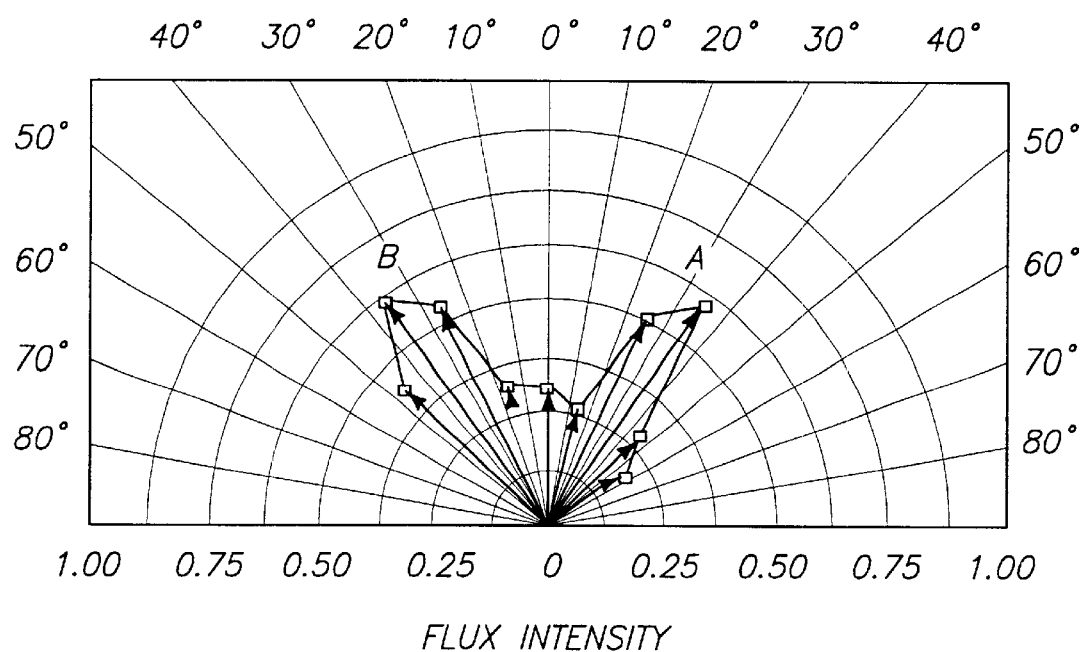
FLUX INTENSITY

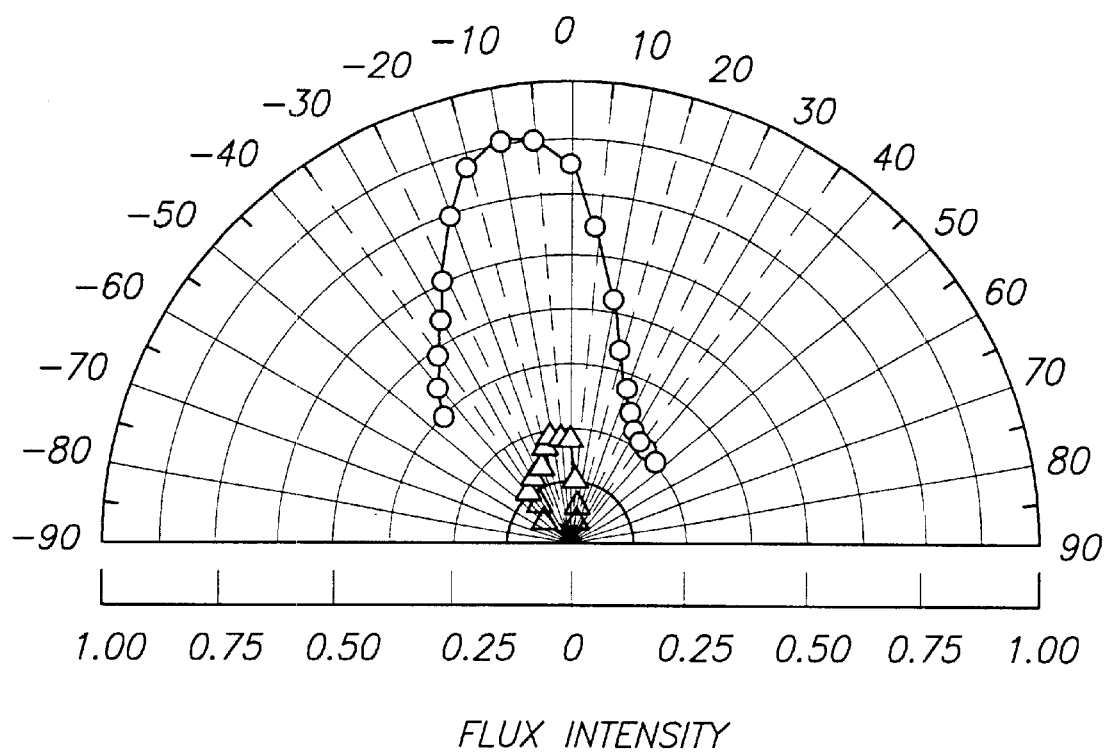
FLUX INTENSITY
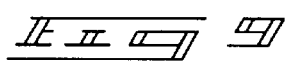

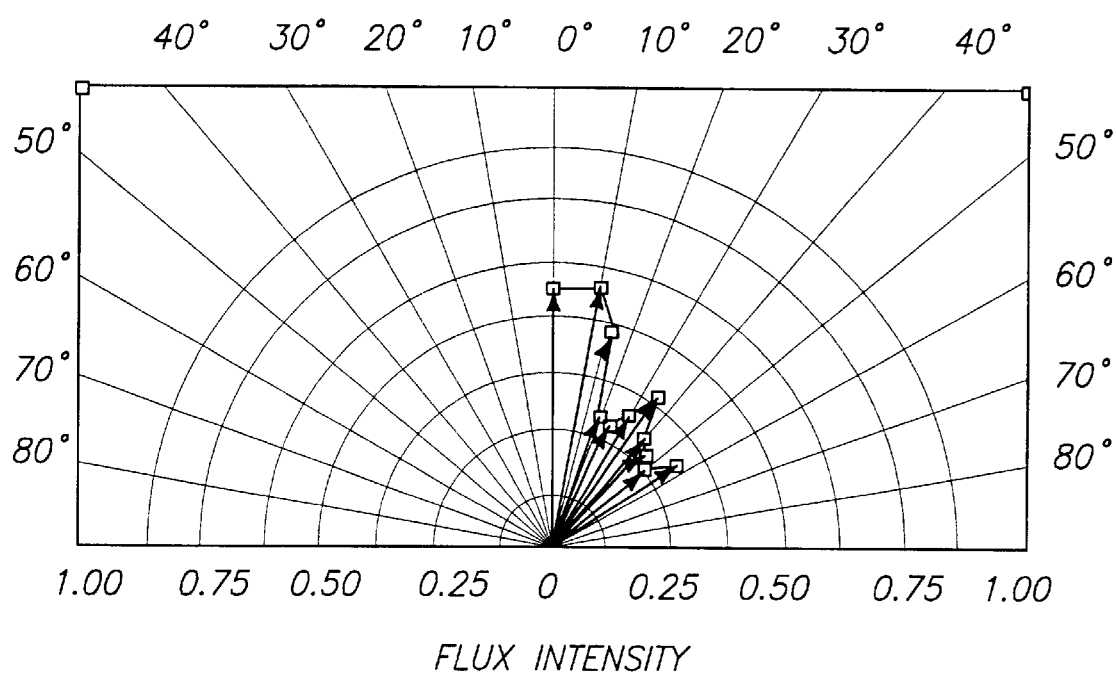
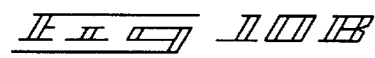

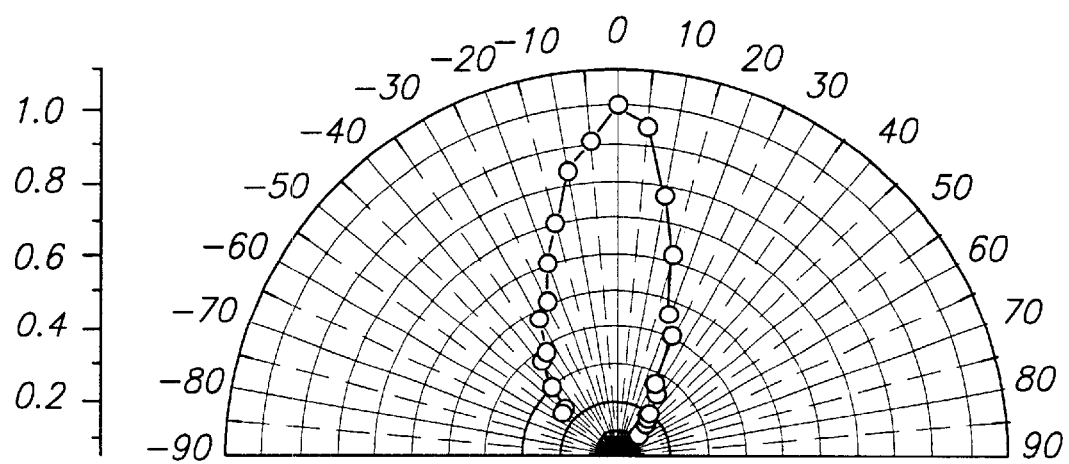

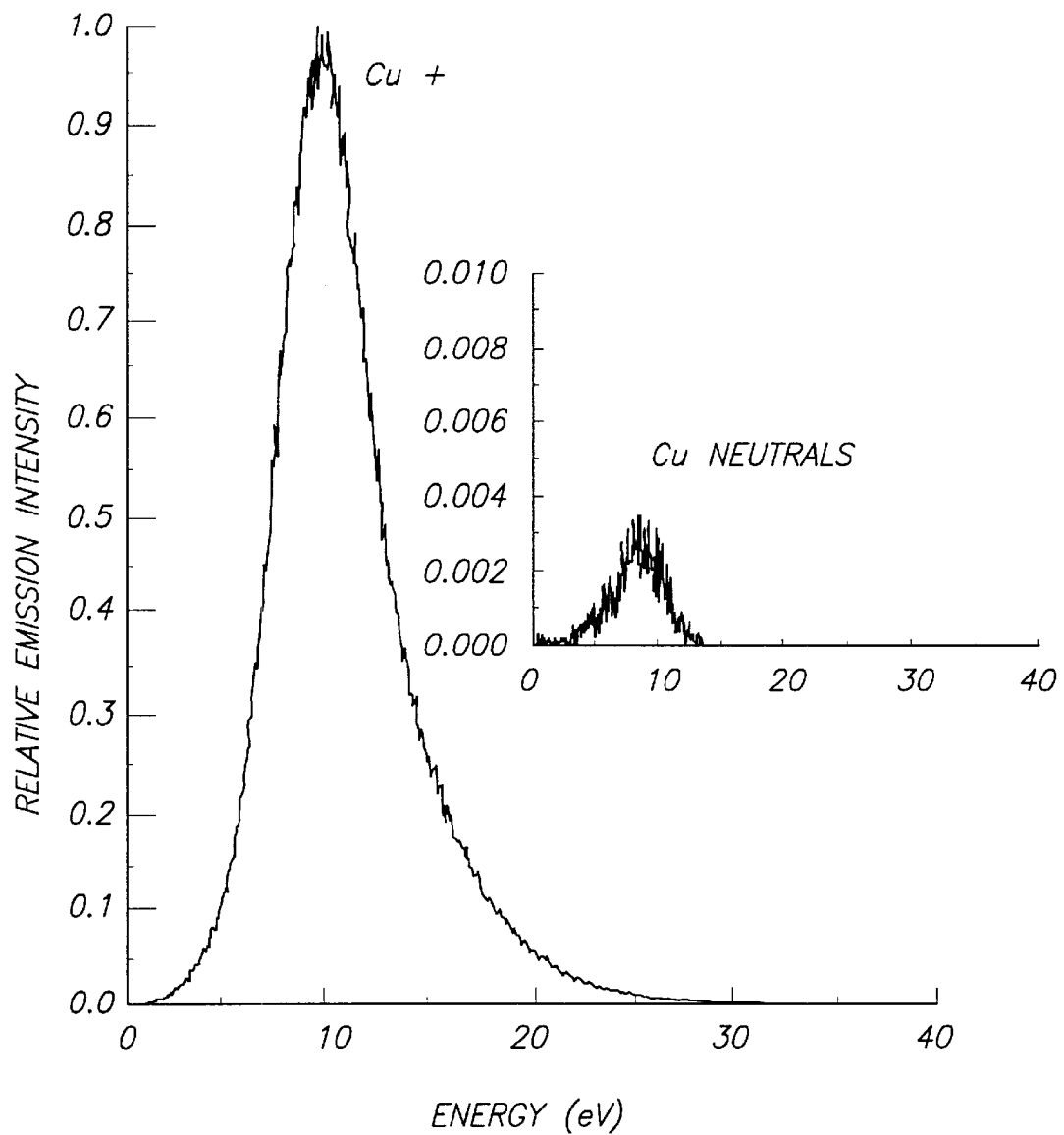

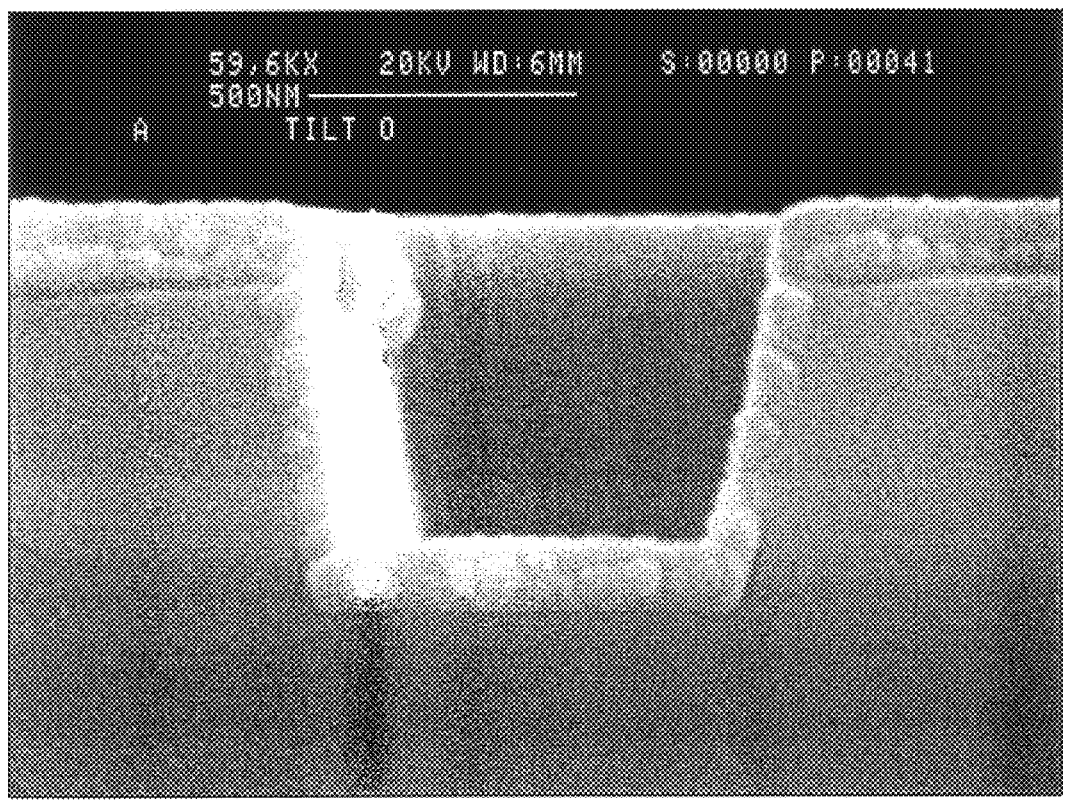

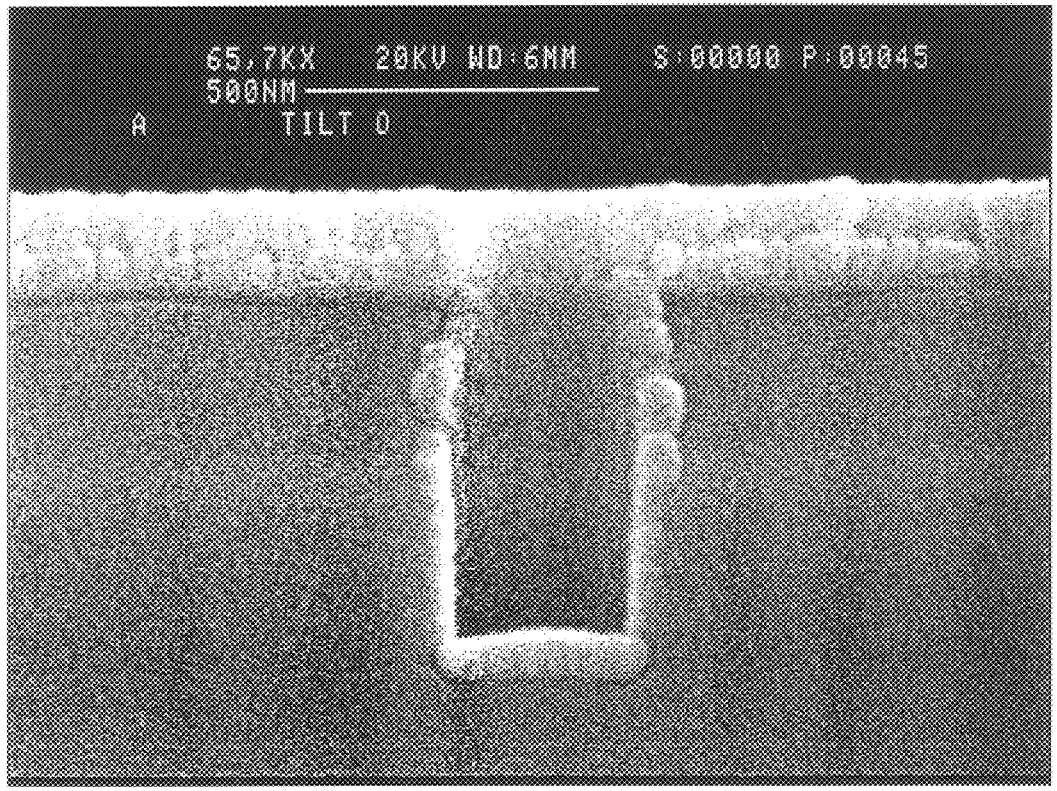

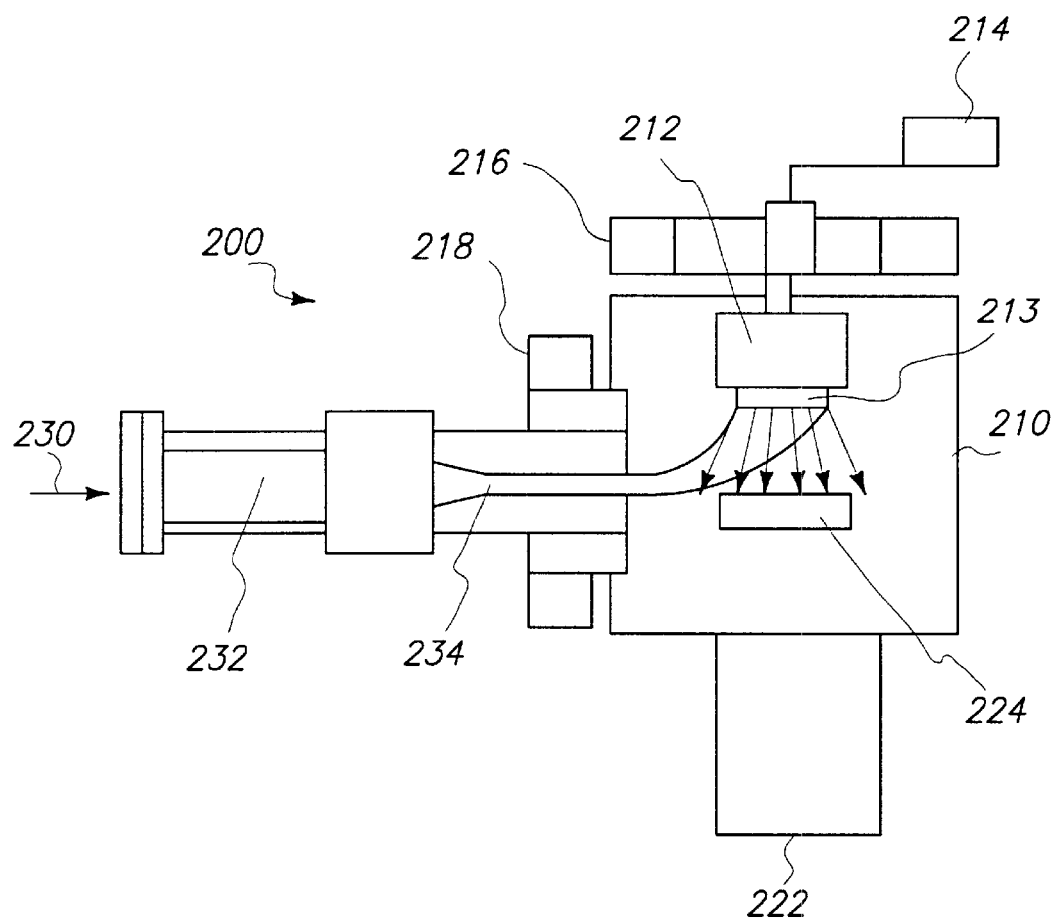

PHYSICAL VAPOR DEPOSITION TARGETS HAVING CRYSTALLOGRAPHIC ORIENTATIONS

This is a continuation-in-part of U.S. patent application Ser. No. 09/559,600, filed Apr. 28, 2000, incorporated herein by reference in its entirety.

FIELD OF THE INVENTION

The present invention relates to the preparation of thin films by magnetron sputter deposition in which the angular distribution of sputtered particles emitted from the target and arriving (depositing) at the substrate is directional. Directional emission and arrival mean that the angular distribution of flux intensity of sputtered particles emitted from the target, and incident at the substrate are each characterized by a narrow peak or peaks on a low level background angular distribution. In other words, the majority of particles emit and arrive at about the same one or few narrow ranges of angles. The directional emission is preserved by ballistic transport to result in the directional arrival.

BACKGROUND OF THE INVENTION

One of the most important commercial processes for depositing thin films of a desired material onto a substrate is sputter deposition, also known as sputter coating or sputtering. Sputter deposition is used extensively in many industries including the microelectronics, data storage and display industries to name but a few. Generally, the term sputtering refers to an "atomistic" process in which neutral, or charged, particles (atoms or molecules) are ejected from the surface of a material through bombardment with energetic particles. A portion of the sputtered particles condenses onto a substrate to form a thin film. The science and technology of sputtering is well known and described for example in Vossen, J. L., Kern, W., Thin Film Processes, Academic Press (1978). Sputtering can be achieved through several techniques. Generally, in "cathodic" ("diode") sputtering the target is at a high negative potential relative to other components, usually through application of a negative bias from a power supply, in a vacuum chamber system, typically containing an inert gas or mixture of gases at low pressure. A plasma containing ionized gas particles is established close to the target surface and ionized gas particles are accelerated by the action of the electric field towards the target surface. The bombarding particles lose kinetic energy through momentum exchange processes with the target atoms, some of the latter particles gain sufficient "reverse" momentum to escape the body of the target, to become sputtered target particles. Note a sputtered particle may be an atom, atom cluster or molecule either in an electrically neutral or charged state. A flux of sputtered particles may contain any one or any mixture of such entities.

One category of sputtering processes is known as magnetron sputtering. Magnetron sputtering is the most widely used form of sputtering and is the mainstay of commercial sputter deposition processes. In magnetron sputtering, crossed electric and magnetic fields generated by a magnetron assist in the sputtering by concentrating sputtering action.

According to the known art, the sputtered particles from a typical magnetron sputter cathode source emit with a cosine distribution or some variant based upon it. See Wasa, K., Hayakawa, S., Handbook of Sputter Deposition Technology, Noyes Publications, 1992. Film thickness distributions generally reflect that of calculations based upon a cosine emission model. See Vossen, J. L., Kern, W., Thin Film Processes, Academic Press (1978); see also U.S. Pat. No. 5,417,833 to Harra et al. Typically in many commercial sputter processes, sputtered particles are incident at the substrate at angles far from normal incidence even under ballistic transport conditions. See Rossnagel, S., J. Vac. Sci. Tech. B., Vol.16, No.5, p. 2585 (1998). This effect is desirable if the substrate features to be coated have low aspect ratios. However, many leading edge technological applications involve, for example, filling deep, sub-micron high aspect ratio trench or via structures or coating high aspect ratio features with a high degree of conformality. However, there are limits on the smallness of the critical dimension of such features that can be conformally covered or filled by PVD.

A directional sputter deposition technology based upon magnetron sputtering (further described below), in which the angular distribution of sputtered particles incident at a substrate/thin film growth surface could be "tailored" to the particular requirements of the thin film application, would be of significant technical and commercial value with a wide scope of technological application. Such a technique may allow the following to be improved: film coverage, engineering and control of thin film microstructure and therefore related functional characteristics of the film. For example, directional deposition would greatly ease step coverage of high aspect ratio features, e.g., channels on patterned surfaces. However, methods proposed to improve directionality, while providing some benefits, need further improvement.

Coating high aspect ratio structures is of critical importance, e.g., in emerging submicron semiconductor interconnect metalization and high density data storage media applications. In such cases the bounds of application of magnetron sputter deposition is approaching its limit. For example, in coating via type structures in microelectronics interconnect applications, it is well known that sputter deposition suffers from film buildout at the upper edges of the via resulting in a trapped void, "keyhole" type film defect as well as other film defects. See, for example, Rossnagel, S., J. Vac. Sci. Tech.B., Vol.16, No.5, p. 2585 (1998). This effect is exasperated with reducing dimensionality and increased aspect ratio. Proponents of current commercial PVD processes assert they can conformally cover relatively high aspect ratio features, or fill relatively high aspect ratio channels or vias, having a critical dimension of at least 0.18 micron, or perhaps greater than 0.13 micron.

Several sputter PVD techniques, many of them developed commercially relatively recently, attempt to control the directionality of the incident sputtered particle flux at a substrate e.g., physical collimation techniques, hollow cathode sputtering, arc sputtering, self ionized sputtering, ionized physical vapor deposition (IPVD) and long throw methods. The latter two techniques probably represent state of the art commercial technologies. The scope, scalability, efficiency and cost considerations of directional sputter technologies have been reviewed by Rossnagel, S., J. Vac. Sci. Tech.B., Vol.16, No.5, p. 2585 (1998). The best techniques utilize tooling and/or process attributes to achieve a degree of control over the angular distribution of incident sputtered particles. These methods are in fact expressly designed to overcome what are believed to be inherent deficiencies in basic magnetron cathode sputter deposition characteristics and target materials design which limit control of the substrate incident angular sputtered flux distribution.

For example, in IPVD techniques a coil is located in the vacuum chamber between the sputtering cathode and substrate on which the film is to be deposited. The coil is configured to form a secondary plasma in the region above the substrate. The magnetron sputtered particles pass through a relatively high pressure ambient for creating the desired secondary plasma to undergo significant gas phase scattering, ionization (partial) in the secondary plasma followed by electrostatic deflection towards the substrate surface, generally provided by electrically biasing the substrate. At the substrate, partial resputtering of the growing film by the electrostatically accelerated particles is used to control film characteristics. For example bottom and sidewall coverage in semiconductor interconnect applications. Clearly complex post sputter emission processes are central to the directionality and the degree of conformal coverage achieved by the IPVD technique.

U.S. Pat. Nos. 5,948,215; 5,178,739; and Patent Cooperation Treaty published application No. WO 98/48444 disclose ionized plasma vapor deposition processes, and are incorporated herein by reference.

Long throw methods utilize ballistic (i.e., collisionless) transport and a long throw path to the substrate to "optically" filter the magnetron cathode emitted flux such that only relatively low angle components of the emitted flux (i.e., those close to the target normal) are incident at the substrate. The long throw process is clearly inefficient through flux dilution and suffers from inherent asymmetries in the incident flux. See Rossnagel, S., J. Vac. Sci. Tech. B., Vol.16, No.5, p. 2585 (1998).

Directional sputter emission from single crystals, see Werner, G. K. Phys. Rev. J. Appl. Phys., Vol. 26, p. 1056 (1955) and ibid., Vol. 102, p. 690 (1956), and polycrystals, see Werner, G. K., Rosenberg, D., Phys. Rev. J. Appl. Phys., Vol. 31, No. 1, p. 177 (1960), has been known for many years from work in diode sputter systems (not magnetron systems). However, referred emission has remained a laboratory result and has not been put into substantive practical application. This is probably due to several factors e.g., the cost and practical difficulty of producing large single crystal targets, together with problems due to reproducibility of the effect and the dominance of the magnetron sputter cathode in commercial applications of sputtering (The rate of deposition in diode sputtering is generally non-viable for many commercial applications). Initial experiments studying sputter emission from polycrystalline targets using diode sputtering techniques, see Werner, G. K., Rosenberg, D., Phys. Rev. J. Appl. Phys., Vol. 31, No. 1, p. 177 (1960), did not show directional effects in several elemental systems. Directionality has been observed for sputtering of crystallographically textured polycrystalline targets using angularly collimated, monoenergetic ion beams. See Tsuge, H., Esho, S., J.Appl. Phys., Vol. 52, No.7 (1981), Smith. P. C. et al, J. Vac. Sci. Technol. a 17(6), p. 3443, November/December 1999. Factors inherent in the design and operation of magnetron sputter cathodes differentiate them from diode sputtering and sputtering through angularly collimated, monoenergetic ion or particle beams which affect the sputtered particle emission profile. For example, in contrast to magnetron sputtering there is no racetrack in diode sputtering, neither is the sputtering flux monoenergetic as in ion beam studies, see for example Vossen, J. L., Kern, W., Thin Film Processes, Academic Press (1978). Magnetron sputtering of crystallographically textured targets has been used as a means "to point the emission distribution in a more normal distribution". See Rossnagel, S., J. Vac. Sci. Tech.B., Vol.16, No.5, p. 2585 (1998). It has not however been sufficiently developed for technological application as a directional technique as demonstrated by the pre-eminence of IPVD and Long Throw techniques. See Rossnagel, S., J. Vac. Sci. Tech.B., Vol.16, No.5, p. 2585 (1998).

In general, magnetron sputtering uses crossed electric and magnetic field configurations to concentrate the sputtering action. Generally a negative bias is applied to the target, hence the magnetron and target assembly, which form the basic elements of the sputter source, is referred to as the cathode or magnetron sputter cathode. Typically, but not exclusively, magnets are positioned behind the sputter target. Magnetic field lines penetrate the target, threading through the low-pressure gas environment above the target before re-entering the target body. The configuration of crossed electric and magnetic fields are designed to confine electrons emitted through the bombardment of the target by energetic gas phase ions (and/or atoms) and increase the effective path length of ionizing electrons. A drift velocity is imparted on the electron motion. Their net motion describing a closed loop or so called "racetrack". The overall effect is to increase the efficiency of ionizing the process gas and therefore the density of ions in the plasma. The consequent increased target bombardment enhances the efficiency of the sputtering process.

Both fixed and movable magnet structures have been utilized in magnetron sputtering. In one prior art sputtering system utilizing a moving magnet, the target is circular and the magnet structure rotates with respect to the center of the target. In a second prior art sputtering system utilizing a moving magnet, the target is rectangular or square and the magnet structure is scanned along a linear path with respect to the target. In a third prior art sputtering system, the target is rectangular and the substrate is moved in a plane parallel to the surface of the target during sputtering. The second type of sputtering system is known as a linear scan sputtering system and disclosed, for example, in U.S. Pat. No. 5,382,344 to Hosokawa et al and U.S. Pat. No. 5,565,071 to Demaray et al, both of which are incorporated herein by reference in their entirety.

Linear scan sputtering systems typically utilize an elongated magnetron assembly that produces a correspondingly elongated closed-loop racetrack plasma profile. The magnetron (magnet) assembly is reciprocally scanned parallel to the target surface and perpendicular to the long dimension of the magnetron assembly. As the magnetron assembly is scanned with respect to the target, the plasma follows the instantaneous position of the magnetron assembly, as a scanning racetrack, and sputters areas of the target. The magnetron is typically behind the target assembly, but other configurations are possible. The target assembly may include a sputter target and backing plate or be of monolithic construction, that is, the sputter target and backing plate are formed from a single piece of material. This assembly may include several possible elements in addition to the sputter target and backing-plate, for example, possibly a heat exchanger assembly. Considerations of the total thickness and magnetic characteristics of these components and the spacing between the magnetron and the target assembly will have a significant impact on the intensity of sputtering produced and therefore deposition rate. Erosion anomalies are typically observed in linear scanning systems at the scan amplitude extremities. Importantly, in conventional linear scanning systems such erosion anomalies are generally undesirably reflected to some extent in the film thickness distribution and also lead to inefficient utilization of the sputter target, reducing its service life through localized enhanced wear. U.S. Pat. No. 5,855,744, incorporated herein by reference in its entirety, asserts a system to compensate for the effects of erosion anomalies.

SUMMARY OF THE INVENTION

An object of the present invention is to provide a sputtering process having directional sputter emission, ballistic transport, and directional arrival of sputtered particles (ions and/or neutrals) at the substrate/film growth interface.

Another preferred object of the present invention is to provide uniformly homogeneously coated substrates.

Another preferred object of the present invention is to provide devices for use in sputtering.

Another preferred object of the present invention is to sputter from a target such that the maximum angle of peak particle emission from the target is below a prespecified angle with respect to the target normal (on an unsputtered, planar target).

Another preferred object of the present invention is to enhance directional sputter emission by providing a method employing cathode operating parameters to reduce the intensity of the influence of high angle components, i.e., sputtered material emitted from the target at a high angle away from the global maximum of the sputtered material flux, relative to desired low angle components.

The present invention relates to a new sputter deposition technology that offers advanced control over the substrate incident angular sputtered flux distribution with process simplicity. This technology differs from other techniques in that controlled sputter emission from the magnetron sputter source, based upon improved materials and cathode design, is central to the technique. The cathode comprises the target and the magnet assembly of the magnetron. Specifically, the technology is a combination of (1) engineered materials design and preparation of the sputter target to promote directional sputter emission, (2) the nature, design and operation of the sputter cathode, and (3) the process, in which sputtered particle transport is essentially ballistic.

These elements in proper combination and use largely preserve beneficial attributes of the engineered directional emission characteristics of the sputter target materials through ballistic transport of the emitted particles and simple geometric considerations, which promote a high degree of directionality to the substrate incident sputtered particle flux.

Directional emission refers to an angular distribution of as-emitted sputtered particles whose flux intensity is characterized by a distribution of particles in which the majority of emitted particle flux is contained within a narrow peak, or peaks, superimposed upon a low level background angular distribution.

Thus, ideally, most of the flux arrives at the substrate at about the same one or few narrow ranges of angles most characteristic of emission from the target material. In particular, the particles are emitted from the target over a range of angles such that there is at least one local maximum of particles emitted at a respective angle in the range, and the total number of particles emitted within plus or minus 20° of the respective angle of each local maximum constitutes a majority (preferably 80% or more preferably 90%) of the emitted particles. Preferably, the particles are emitted from the target over a range of angles such that there is a global maximum of particles emitted at a respective angle in the range, and the total number of particles emitted within plus or minus 20° of the respective angle of the global maximum constitutes a majority (preferably 80% or more preferably 90%) of the emitted particles.

For example, the majority of sputtered material (preferably at least 80 or at least 90% of the sputtered material) may be emitted within a distribution of less than plus or minus 20° of the first peak plus the sum of the material less than plus or minus 20° of the second peak totals to be the majority of the sputtered particles.

Preferably, regardless of whether there are one or more peaks, the majority of the emitted particles are emitted within a total range of at most about 40°, more preferably at most about 30°.

For example, the process may be designed such that for a target material designed to have emission at a particular angle, most of the particles will emit at or about that angle. Thus, by properly positioning the substrate relative to the target, the majority of the emitted particles will impact the substrate at or about 90°. This makes it much easier to uniformly coat high aspect ratio features on the substrate.

The energetics of the majority of incident particles are generally insufficient to cause significant resputtering of the growing film.

The present invention relates to a directional thin film magnetron sputter deposition process for any directionally emitting target material or surface comprising, employing a scanning sputtering device to incrementally sputter material from the target material. The process desirably achieves uniform erosion of the sputter target over the target material life. Thus, an advantage of the process is that directional emission from the target, ballistic transport, and directional arrival at the substrate of sputtered material is effected and maintained.

To facilitate ballistic transport, the substrate is positioned at, or less than, the process free path of the majority of emitted particles from the emitting target surface.

In particular, the substrate is positioned, with respect to the sputter target, such that the majority (preferably at least about 80%, more preferably, at least about 90%) of emitted particles from the directionally emitting target surface experience ballistic transport across the space between the target and the substrate. This results in directional arrival of a majority of the emitted particles at the film growth surface of the substrate.

By applying at least a suitably sufficient power density during sputtering, directional emission can be obtained from a wider variety of target materials. In particular, raising power density can further reduce the intensity of the influence of high angle components relative to low angle components. The high angle components are defined as sputter target material emitted at a high angle, e.g., more than plus or minus 40°, away from the global maximum peak of flux of material emitted from the sputter target. Preferably, the low angle components are sputter target material emitted within plus or minus 20° of the global maximum peak. When the global maximum peak is significantly away from being normal (90°) to the target surface, the target (or substrate) may be tilted to cause the emitted sputtered material to arrive at a desired angle. Unexpectedly, the high power removes unwanted potential high angle components.

Sputtering may also be through an ionized gas phase target species or so-called self sputtering in which (unlike IPVD with a secondary plasma) a self sustaining sputtering plasma is formed from the target species, requiring little or no plasma support gas once initiated.

The present technique may also be suitable for reactive sputtering. Reactive sputtering is generally described by Vossen, et al, Thin Film Processes, Academic Press (1978), incorporated herein by reference. Typically, in reactive sputtering a reactive gas or gases is added to an inert gas such that the plasma contains reactive species allowing the formation of compound thin films. Reactive gases can include for example oxygen, nitrogen, methane, hydrogen sulfide, hydrogen, carbon monoxide, etc. as is well known in the art.

In its device aspects, the present invention provides a device for magnetron sputtering. In particular, the device employs a magnetron housing and its sputtering process housing, the two housings being separated by a target, its backing and a cooling panel, wherein there is a low difference in pressure between the two housings.

BRIEF DESCRIPTION OF THE DRAWINGS

FIG. 5 shows in-plane sputter emission data taken simultaneously in two orthogonal half planes (A) and (B) from the same region of a copper single crystal whose <110> direction is normal to the surface plane of the crystal.

FIG. 7B shows spatially resolved, high resolution, integrated, full hemisphere, directional emission profile.

FIG. 9 illustrates directional emission as a function of power applied to the sputter target.

FIGS. 10A and 10B are spatially resolved, integrated, full hemisphere, emission profiles.

FIG. 11 illustrates directional emission produced by sputtering in Krypton.

FIG. 12A shows data from Example 12 of the energetics and relative flux intensities of monovalently charged, positive Copper ions and Copper neutrals arriving at 0 degrees.

FIG. 12B shows a plane section, directional arrival profile of positive Copper ions produced from Argon sputtering of a Copper (110) single crystal in Example 12a.

FIG. 13A shows a plane section, directional arrival profile of positive Copper ions produced from Argon sputtering of a Copper (110) polycrystalline sample in Example 13a.

FIG. 14A shows a plane section, directional arrival profile of positive Copper ions produced from Argon sputtering of a Copper (110) single crystal in Example 14a.

FIGS. 21–24 illustrate conformal step coverage by a linear scanning magnetron cathode device of Examples 17a, 17b, 17c and 18, respectively.

FIG. 25 is a schematic diagram of a remote plasma deposition apparatus.

DETAILED DESCRIPTION OF THE PREFERRED EMBODIMENTS

Figure 1A:
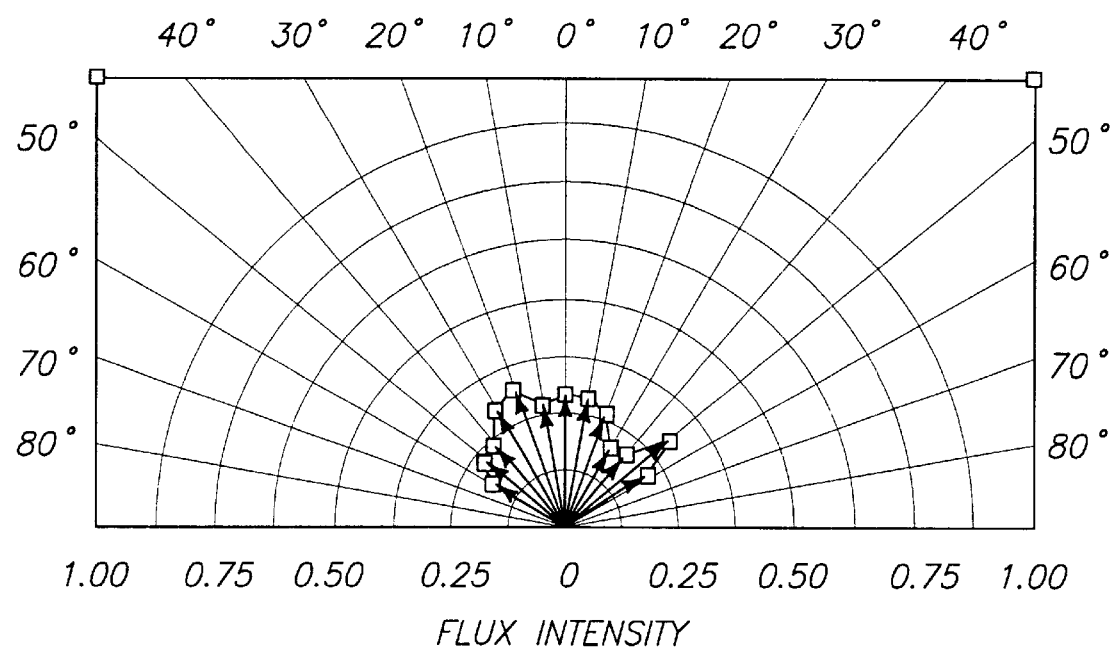
FIGS. 1A and 1B show spatially resolved plane section non-directional sputter emission profiles from (100) and (110) textured polycrystalline Aluminum sputter targets respectively.

In the present invention, several elements must be advantageously combined in a practical manner to effect the deposition technique.

1. Fundamental directional sputtered particle (neutral or charged) emission characteristics from the sputter target surface through target materials engineering design, surface preparation and use.
2. Maintaining directional emission from the target surface through cathode design, operation and process parametrics.
3. Ballistic, or practical minimization of gas phase scattering, e.g., by positioning the substrate at or less than the "process free path", or through a transport regime characterized by a small number of low angle scattering events of sputtered particles from the cathode to the substrate.
4. Optional use of rocking the cathode or substrate, cathode multisourcing, high angle collimation or statically angularly disposing the substrate with respect to the cathode or cathodes.

Typical suitable techniques to practice directional magnetron sputtering of the present invention include dc sputtering, rf sputtering, microwave sputtering, or other suitable frequency techniques. Ionization enhancements of the magnetron plasma, for example, through triode sputtering techniques or hollow cathode electron sources, magnet arrays, etc. may also be used. Other techniques may also be utilized. For example, static or scanning plasma "beams" from remote plasma generation sources with electrical biasing of the sputter target to produce diode sputtering. Thus, other than magnetron sputtering, alternative methods may be employed in which directional emission of the sputtered material is effected and maintained upon arrival at the film growth surface of the substrate. Such alternative methods include:

diode sputtering, wherein the plasma can be local, or produced from a remote source, and has a density of sufficient uniformity over the region of the target producing deposition at the substrate to maintain a naturally directional emitting surface condition throughout service life of the target, scanning plasma beam sputter deposition, wherein the plasma beam is scanned across the target to produce uniform erosion over the region of the target producing deposition at the substrate to maintain a naturally directional emitting surface condition throughout service life of the target, static ion beam sputter deposition, wherein the ion beam has a density of sufficient uniformity over the region of the target producing deposition at the substrate to maintain a naturally directional emitting surface condition throughout service life of the target, or scanning ion beam sputter deposition.

In other words the instant invention described herein may also be enabled by other thin film sputter techniques, although magnetron sputtering is currently its most preferred mode of practice in the art. The only differentiation in these techniques relative to scanning magnetron sputtering is in the generation and application of target sputtering particles. All other aspects of the invention remain the same, that is, in the present invention the following several elements are advantageously combined in a practical manner to effect the directional deposition technique:

1. Fundamental directional sputtered particle (neutral or charged) emission characteristics from the sputter target surface through target materials engineering design, surface preparation and use.
2. Maintaining directional emission from the target surface through sputtering particle source design, operation and process parametrics.
3. Ballistic, or practical minimization of gas phase scattering, e.g., by positioning the substrate at or less than the "process free path", or through a transport regime characterized by a small number of low angle scattering events of sputtered particles from the sputter target to the substrate.
4. Optional use of one or more techniques such as rocking or scanning target incident sputtering particles, rocking or scanning the target, rocking or scanning the substrate, multisourcing, high angle collimation and statically angularly disposing the substrate with respect to the sputtering particles.

For example, the DAPVD technique may be practiced using remotely generated plasmas to effect diode sputtering of the target (described earlier) in which the sputtering plasma may be "static" (if sufficiently uniform) or scanned (by scanning plasma beam sputtering) over the target surface in a manner similar to magnetron scanning to avoid non-uniform erosion of the target surface. Non-uniform erosion is undesirable because it may eventually result in loss of the naturally, directionally emitting surface effect. Similarly, static or scanning ion or particle beam sources may be employed in like manner and consideration.

Scanning plasma beam sputtering with remote generation of the sputtering plasma and techniques to guide the plasma to the target surface for diode sputtering have been described by Elizabeth Valeron, Sputtering Advance Reaches the Target, Vacuum Solutions, p. 23, IOP Publishing, Ltd. (September/October 2000), incorporated herein by reference in its entirety. Sputtering through remote plasma generation removes the interdependence of target voltage and current that occurs in conventional diode and magnetron sputtering. A sputtering bias can be applied to the target independent of the plasma generation process. Further, conventional commercial diode sputtering processes which use a locally generated plasma typically require operating process gas pressures in excess of that for practical application of the DAPVD technique (see, for example Vossen, J. L., Kern, W., Thin Film Processes, Academic Press (1978)), i.e. process free paths would be generally impractically small. In contrast, remote plasma generation techniques enable use of low pressures in the target to substrate space thereby facilitating application to the DAPVD technique. "Local" generation means generated by (i) an electrical bias only applied to the sputtering target or (ii) an electrical bias applied only to the sputtering target in conjunction with a magnetron device. "Remote" generation means the plasma is generated independently of the sputter target.

FIG. 25 shows a drawing taken from Valeron of a device 200 for scanning plasma beam sputtering with remote generation of the sputtering plasma. The device 200 of FIG. 25 includes a target holder 212 and target 213 connected to a DC bias and located in a chamber 210. A substrate table 224 is also located in the chamber 210. A steering electromagnet 216 is located above the chamber. A pump system 222 communicates with the chamber 210 to control chamber pressure. A side arm 230 communicates with the chamber 210 and includes a plasma gas inlet 231 and launch electromagnet 218. The gas, e.g., argon feed 236 passes into the gas inlet 231, passes through a conventional glow discharge region 232 and forms a highly ionized plasma "beam" which passes into the chamber to contact the target 212. A key feature in the device of FIG. 25 is that the plasma is generated remotely. For example, where argon is employed as the plasma gas, the high intensity argon plasma 234 is generated in the side arm 230. Electromagnets 216, 218 focus the plasma electrons into an intense plasma beam, and deliver it directly onto the target 213. Argon ions formed in the chamber are accelerated towards the target 213 by an applied negative bias.

Ion or particle gun sources for static ion beam sputter deposition or scanning ion beam sputter deposition, are well known in the art, see for example Vossen, J. L., Kern, W., Thin Film Processes, Academic Press (1978). Sputtering of a target through particle beam sources generally employs sufficiently low process chamber pressures to permit the DAPVD technique. Again, if the incident beam of sputtering particles is sufficiently uniform or scanned, for example by mechanical motion of the source or electrostatic scanning of the beam, generation of a non-directionally emitting target surface condition may be avoided so long as the other above mentioned process features and target features are employed.

However, in contrast to the above described alternative techniques, magnetron sputtering, is currently preferred due to its superior deposition rates for most target materials.

Figure 16:
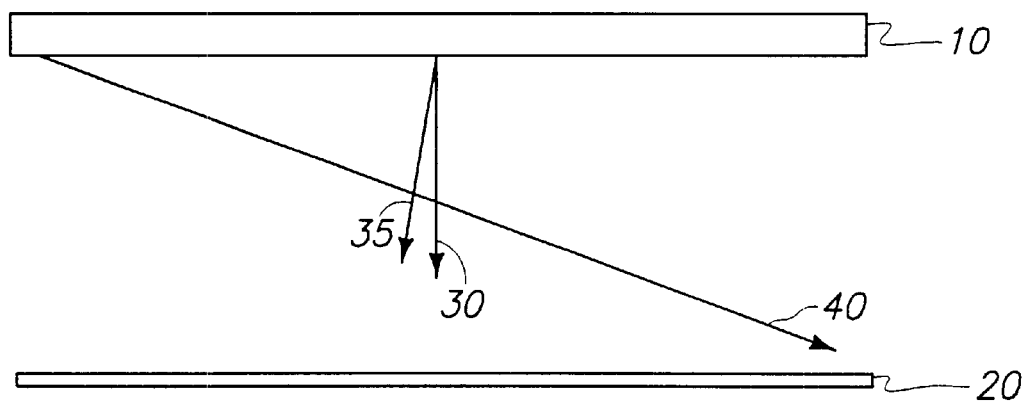
FIG. 16 shows a hypothetical two-dimensional sputtering system that explains non-uniform operation to be minimized by the present invention.

A goal of the present invention is to achieve directional PVD and/or IPVD by magnetron sputtering without a secondary, post emission ionization stage beyond that ionization produced by the cathode. In contrast, FIG. 16 qualitatively shows a schematic non-directional system comprising a target 10 and a substrate 20. The target emits particles in a stream 30 normal to the target 10 surface and streams of particles 35, 40 not normal to the target 10 surface. Theoretically, particle stream 40 may cross from the left end of the target to the right end of the substrate. The present invention seeks directional emission from the target. Thus, cross streams such as stream 40 would be minimized or limited to less angled streams qualitatively shown as stream 35.

Figure 20:
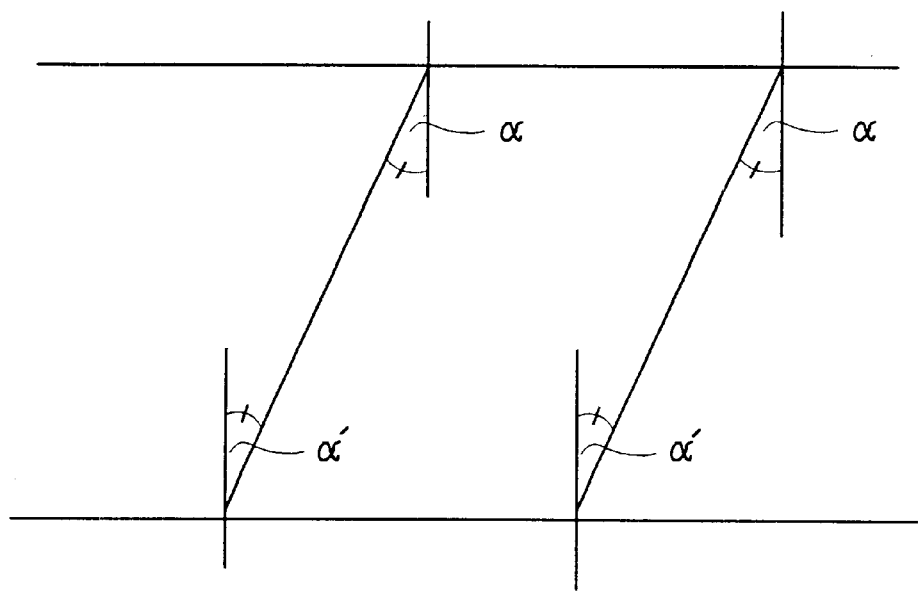
FIG. 20 shows ideal directional performance in which the sputtered particles travel along parallel paths.
Figure 2C:
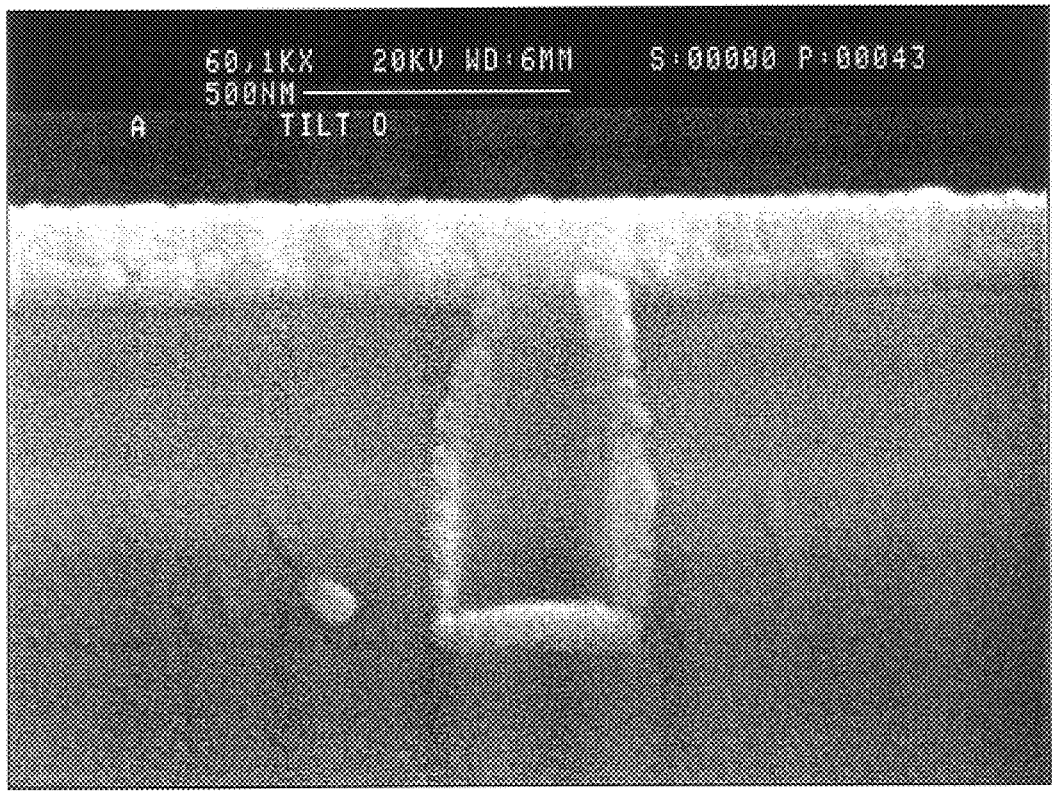

FIG. 20 shows ideal directional performance in which the sputtered particles travel along parallel paths 31 in which the particles emit from the target 10 at a same angle α relative to normal (the angle could be 0 degrees or more) and arrive on the substrate 20 at a same angle α relative to normal. When the target 10 and substrate 20 are parallel, α and α are corresponding equal angles as shown in FIG. 20.

Target Materials

Figure 18:
FIG. 18 shows a schematic drawing of an embodiment of a mosaic target of the present invention.
Figure 19:
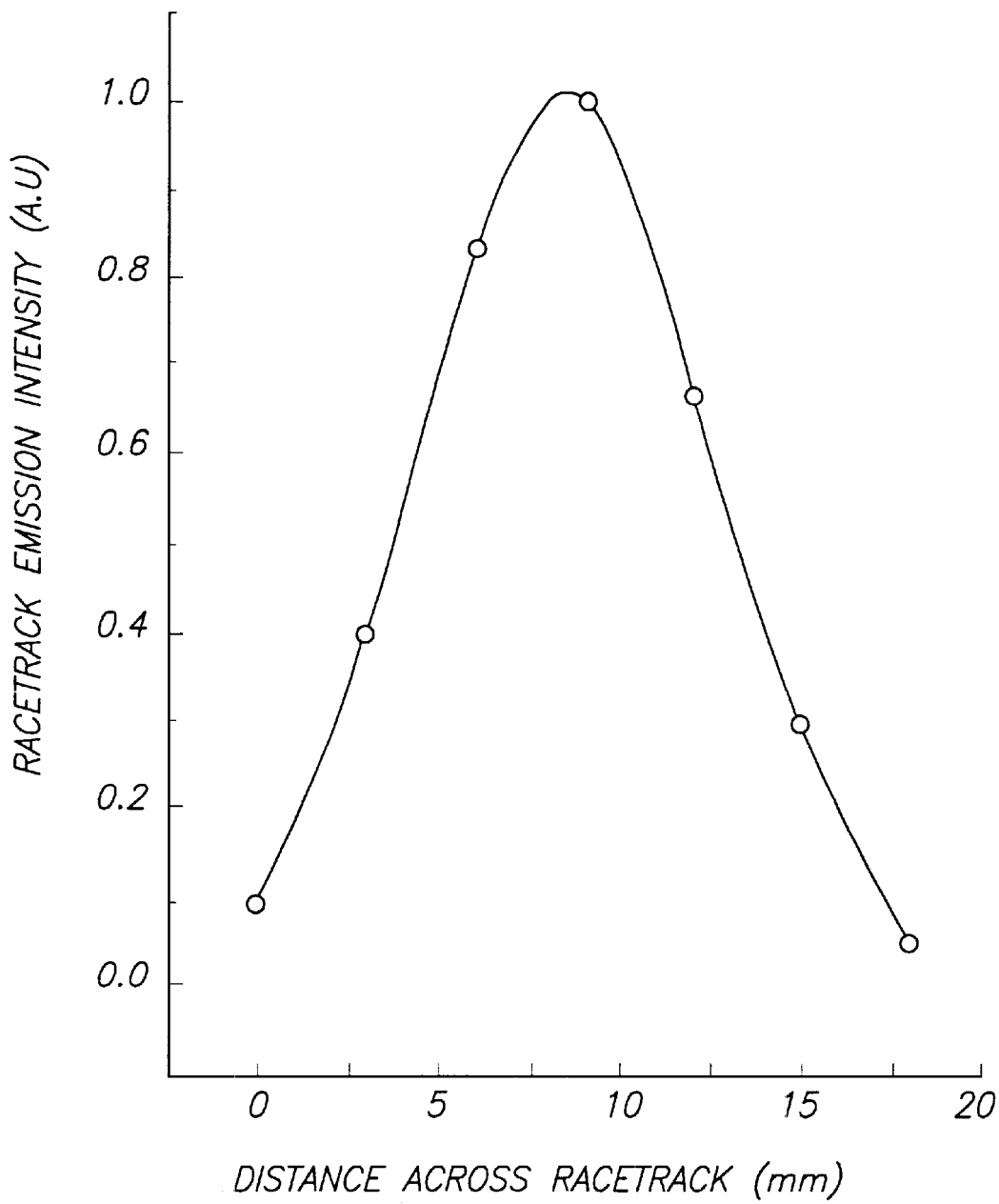
FIG. 19 is a racetrack intensity profile taken at an angle 0 degrees for Example 16.

An important, but not exclusive, element of the invention described herein is in the use of strong crystallographically textured, highly uniform (across its area and through target thickness) polycrystalline target materials and/or single crystal sputtering targets (which may be one piece or mosaic structures comprised of several pieces of single crystal of one or a mixture of crystallographic orientations) in a manner to produce a highly directional emitted sputtered particle flux from a scanning magnetron sputtering device. FIG. 18 shows pieces 210 of a mosaic 200 may be rectangular and arranged like a grid or chess board on an underlying backing (not shown). However, the pieces may have irregular or non-equal shapes (not shown). Also, sputter target surfaces whose structures are modified from the bulk target material could exhibit directional sputter emission effects. Note, the degree of texture is generally defined herein through the Multiple of a Random Distribution (MRD) (or density). The MRD being determined by X-ray diffraction (XRD) pole figure measurement. The MRD compares an orientation density with that of a sample with no preferred orientation (uniform distribution). Other simpler descriptions relate the intensity of the diffraction signal from a given orientation in terms relative intensity (ratio) with respect to diffraction from other specified peaks or a specific peak in the XRD spectrum.

For coating according to the present invention, e.g., high aspect ratio surface features (e.g., surface features having an aspect ratio of at least 3, typically 3 to 12), the emission profile of sputtered particles is ideally dominated by low angle flux components (with respect to the planar sputter target geometric surface normal prior to sputtering) to form a narrow angular distribution emission "lobe" or lobes. This may be effected from a single crystal or highly textured polycrystalline material in which there is a dominant certain texture or from a suitably engineered polytextured material in which certain textural components having desired emission components are combined and distributed in appropriately controlled volume fractions to produce a desired emission spectrum. Generally for directional emission, a dominant texture is preferred. For example (110) textured fcc metals can exhibit such emissions conveniently about the sputter target surface normal negating the need for appropriately orientating the cathode or substrate, as shown by examples demonstrated herein.

Further, studies by the present inventors on single crystal emission have shown emission can be conal, or approximate to conal, e.g., in Cu (110) and (111) systems shown in examples herein. That is, emission directionality can be achieved in two dimensions, a factor desirable in the practical implementation of the present deposition technique and in sputter target materials design in either single crystal or polycrystalline systems. When considering deposition using polycrystalline targets, other target attributes such as grain size and grain size distribution may be important. The distribution of in-plane grain rotations may cause localized variations in the sputtered particle emitted angular distribution (EAD) which will consequently be reflected in the deposited thin film if the emission is non-conal in nature.

In-house studies of sputtered particle energetics have confirmed sputter emission is a near surface effect. Most emission was found occurring from depths within a few atomic layers from the surface. The condition of the target surface therefore strongly affects the angular distribution of as-emitted sputtered particles for both single crystal and polycrystalline targets. The initial surface crystallographic texture and topology, presence of surface defects, such damage including that induced during fabrication, for example strain effects and/or contamination, e.g., foreign material, oxides etc. of the sputtering target prior to sputtering are factors that may affect the emitted angular distribution (EAD) and directionality. Also, the target's surface topology, texture and/or surface damage produced by particle irradiation developed through the sputtering process (related to power applied to sputter the target, sputtering gas species and other process variables), backsputtered particles and sputter generated contaminant films, etc., are factors that may affect the emitted angular distribution (EAD) and directionality.

Generally, polycrystalline commercial targets have a high quality commercial no. 16-32 machined finish prior to sputtering. Single crystals typically have a diamond turned mirror finish or chemo, or chemomechanical surface preparation. Sputter conditioning can then be applied, if required, to establish directional emission in suitable target materials through removal of surface contamination, damage, etc., and to establish a directionally emitting surface layer. The extent and ability of sputter conditioning required to produce such directional emission is dependent on the nature of the surface preparation. Sputter conditioning occurs as soon as the target is exposed to the sputtering particle flux. Highly polished, low damage surfaces, e.g., diamond turned surfaces may not require any intentional sputter preconditioning or less conditioning than relatively rough, damaged machine finished surfaces.

Maintaining Directionality

From basic considerations at a macroscale, in magnetron sputtering the dynamic development of the sputtered surface topology into a macroscale racetrack groove, through non-uniform sputter erosion, alters the effective angles of incidence of the incident sputtering particles at the target surface. From ion beam sputtering studies of the angular dependence of sputter emission of single crystals (See Wasa, K., Hayakawa, S., Handbook of Sputter Deposition Technology, Noyes Publications, 1992), the angular distribution of emitted sputtered particles would be expected to alter as the macroscale racetrack groove develops. It is not so clear, however, how such macroscale arguments apply to the often complex topologies produced by sputtering on the microscale or lower dimensionality. The latter effects are more subtle as the sputtering surface region undergoes dynamic change through differential erosion effects, shadowing, backsputtering, etc., affecting the physical nature of the target surface produced, which would be expected to affect accordingly the angular distribution of emitted sputtered particles.

A dynamically changing microtopology is always produced during sputtering, even on the surfaces of highly polished single crystals, and given large differences in sputter rate typically exist over the racetrack crossection. However, it is possible to maintain the intrinsic directional flux from single crystal or highly crystallographically textured polycrystalline targets as shown by the examples herein.

The macroracetrack groove is a consequence of the cross-sectionally varying sputter rate across the racetrack induced by the non-uniform racetrack plasma density produced in typical magnetron crossed electric and magnetic fields. Superimposed over the macroracetrack groove and other macrotopological features, e.g., machining grooves in the early stages of target use, develops a fine scale, dynamic, steady state, "natural" sputter topology. "Natural" sputter topologies are complex. Generally, once a "steady state" is reached, they are characterized in metallic target systems by low angle reliefs, i.e., features which generally exhibit angles of less than 30° with respect to the hypothetical surface plane of the target. Differences in height between features in the "steady state" "natural" surface topology are estimated to be less than about 100, generally less than about 50, or typically less than about 30, microns. In other words, the localized difference between the height of a peak and its adjacent valley or plain is less than about 100, about 50 or about 30 microns. Of course, the absolute difference in height between the highest and lowest feature of the target may be over 100 microns, as for example where the target has an overall curved shape. This is intended as a guide rather than a complete description of these phenomena. The natural topology employed with the present invention is that which can be maintained at steady state across the target during sputtering over an extended useful period.

The target surface topology is dynamic during sputtering. Complex erosion mechanisms can allow a dynamic equilibrium, or steady state to be established. For example, the hills and valleys of the topology can effectively erode at differential rates to keep the differences in height between surface features below a predetermined tolerance. The present invention achieves this by employing an overall erosion rate less than that which overwhelms the differences in erosion rates associated with the different heights of surface features in the "natural" topology. As a result, this topology can be maintained in a steady state during sputtering, due to an overall steady erosion, for an extended period of time, e.g., at least 30 minutes, at least one hour, or at least two hours. In contrast, if an overly fast erosion rate is selected and/or a racetrack plasma is applied statically for sufficient duration, the target would decay to an unsuitable macroracetrack scale topology induced by the cross-sectionally varying sputter bombardment rate resulting from the racetrack plasma density profile.

The present inventors have found a general dependence of the natural topology on grain size over the sub-micron to millimeter grain size range. Generally, target grain size is less than, for example, 1 mm. A steady state "natural" topology can be established rapidly in the typical use of a sputter target. The present inventors have shown that, although sputter emission occurs from within the first few surface atomic layers, directional emission can be developed and maintained in suitable highly crystallographically oriented systems even from dynamically forming sputtering surfaces so long as "natural" topologies are maintained. Once a sufficient macroracetrack scale topology develops, significant variations in surface roughness can develop across the racetrack cross-section accompanied by a correspondingly spatially varying effective net macroscale re-orientation of the "natural" sputter induced topology with respect to the angular distribution of incident sputtering particles from the racetrack plasma.

Accordingly, the directional emission effect may be lost, or overwhelmed given sufficient development of a macroracetrack. (Note, the variation in film thickness uniformity as the macroracetrack develops is well known in the art. See for example Vossen, J. L., Kern, W., Thin Film Processes, Academic Press (1978), U.S. Pat. No. 5,126,029 to Tomer, Y. and Dafne, Y.). The effective re-orientation effect is also due in some part to the resultant changing distribution of plasma density and the change in magnetron crossed electric and magnetic fields configuration consequently altering their effect on sputtering ion trajectory as the racetrack macrogroove develops.

An important element of this invention is to preserve a "natural", directional sputter emitting surface through incremental, uniform sputter erosion of the target during use using a scanning, preferably linear scanning, magnetron device. Such a device prevents development of a sufficiently developed macroracetrack, which could extinguish directionality, over the deposition sensitive regions of the device (see "Magnetron cathode design").

Furthermore, in this context, another consideration is to limit target material removal rate per scan pass (applied power, scan frequency, etc.) to preserve the natural topology of the directionally emitting surface region. There are also accompanying considerations relating to limiting the extent of sputtering particle irradiation induced damage to the emitting surface and heating effects which can change crystallographic characteristics.

For example, for polycrystalline pure Copper and $AlCu_{0.5}$ alloy highly (110) textured targets, target temperatures must be below approximately 150° C. and 200° C. respectively to maintain a stable texture during sputtering. These numbers are illustrative but not definitive, the transformation kinetics dependant on many factors e.g., grain size, stored deformation energy, etc.

The present inventors have theorized many characteristics, as explained above, of the "natural", directional sputter emitting surface. In other words, although future study may further the characterizing of a suitable natural topology, many known elements associated with producing this complex phenomenon are described herein. Moreover, one skilled in the art being advised of the present specification will appreciate whether he or she is sputtering with a natural topology or a macroracetrack groove. If there is directional steady state sputtering, this natural topology is being employed. The achievement of directionality is determined through direct measurement of the sputtered particle emission profile through aperturing particle collection techniques, particle mass/energy spectrometry, and/or indirectly through step coverage or degree of fill on suitably high aspect ratio features on patterned substrates, or percentage of sputtered particles passing through a standardized collimator at various distances and angles relative to the target, or any other suitable technique.

In detailed experiments of spatially resolved sputtered particle emission over the plasma racetrack, the present inventors have demonstrated for highly uniform, crystallographically textured, directionally emitting target materials that generally the as emitted sputtered particle flux angular distribution (EAD) is not significantly affected by the shape, i.e., intensity distribution or the particle energy distribution (typically <1000 eV), of the incident sputtering ion flux profile in magnetron sputtering. Rather, only the integrated intensity of the emitted flux profile across the racetrack, point to point, is affected, not the general shape of the emission distribution. The inventors believe this represents new knowledge not previously known in the art and is important knowledge in affecting magnetron design for the present invention. Further, the inventors found, in spatially resolved emission experiments, that emission is not necessarily cosine in nature. Small rotations of the EAD profile can occur. These rotations are believed due to variation of the angle of incidence at the target of the sputtering particles. These can be minimized by suitable cathode operation, design of the magnetrons crossed magnetic-electric field and sputter gas selection.

Further, controlled directional emitted particle flux of such materials can be maintained over an acceptable power density applied to the target until sufficient damage or topological disruption away from the above-described "natural topology" produced by the sputtering ions disrupts the target surface and near surface sufficiently to degrade the directional emission condition. Similarly, e.g., a high degree of backsputtering or development of coarse sputtered surface topology can degrade the directional emission effect. Generally for suitably textured targets, directional emission can be observed after a short or even negligible sputter burn-in period for a variety of carefully applied, surface finishes, e.g., diamond turned, chemically etched, polished (mechanically, chemomechanically, electrochemically) or carefully machined targets.

A variety of target material fabrication techniques are utilized to produce the highly engineered materials necessary for directional (or directed) arrival plasma vapor deposition (DAPVD) application. Cost effective methods are key to commercial viability. However, some materials may exhibit unwanted high angle flux components and/or asymmetric sputter emission. Collimated sputtering and/or refinements in materials engineering may alleviate such short comings. However, cathode operation parameters may be employed to reduce the relative intensity of the flux of high angle components relative to desired low angle counterparts.

High angle emission flux components can be reduced relative to a desired low angle flux component through control of the characteristics and nature of the sputtering particles incident at the target in the DAPVD technique. Wasa, K., Hayakawa, S., Handbook of Sputter Deposition Technology, Noyes Publications, 1992 teaches that for diode sputtering that variation of incident particle energy affects the angular distribution of sputtered particles from a target. Current knowledge suggesting a tendency for under-cosine emission (sideways, high angle ejection) at energies typical of magnetron sputter deposition, tending towards a cosine emission distribution with increasing energy of the sputtering particles as the typical upper limit for magnetron sputter deposition is approached (approx 1 KeV). However, the present inventors further discovered, at least for some targets, that even for sputtering with particles with energies typical in magnetron sputter deposition that employing sufficient power to the sputter target in the present invention can assist in controlling the angular distribution of particles emitted from a target. For example, applying sufficient power to a (110) single crystal or highly (110) crystallographically textured polycrystalline sputter target can significantly reduce the high angle emission components relative to their low angle counterparts. This is a highly desirable effect in conformally coating or filling high aspect ratio features of sub-micron dimensions, e.g., via's or trench structures on a substrate to avoid or reduce formation of keyhole defects.

Vossen et al, Thin Film Processes, Academic Press (1978), discloses typical magnetron cathode current-voltage characteristics in which current density increases more rapidly than voltage with increasing applied power to a magnetron cathode. Thus, in view of Wasa et al, which teaches to change voltage to affect distribution, and Vossen et al, which teaches that increasing power has relatively little effect on voltage, it is unexpected that increasing power to a magnetron cathode would significantly affect distribution.

The present inventors theorize the present effect is more related to the rate of introduction of energy into the target surface resulting from localized power density variations and the resultant sputtering particle flux rather than sputtering particle energetics (related to target voltage).

The inventors theorize that, for a given sputtering species (Ar, Kr, etc), there exists lower and upper bounds to applied power density (and thereby current density) that promote or degrade the desirable target emission and arrival characteristics in the DAPVD technique. The magnitudes of a lower power density threshold for directional emission and upper limiting power density for directional emission will depend on the nature of the material comprising the sputtering target, for example, its constitution, crystallographic texture and degree of orientation, grain size, and/or nature of and density of defects, stored strain energy. Further, the magnitudes of a lower threshold and upper limiting power density will depend on the characteristics of the particular magnetron used in the cathode. Spatially and angularly resolved studies of sputter emission characteristics across the racetrack cross-section, reveal considerable variation typically exists across the racetrack cross-section in the emission intensity. This implies considerable variation in bombarding sputtering flux and power density.

Thus, it is theorized that the effects shown by examples in these studies, which apply to observations of sputter emission from the regions of maximum racetrack emission intensity of a particular magnetron, unless stated otherwise, indicate the development of a desired DAPVD emission/arrival characteristic is contingent upon a sufficient portion of the racetrack cross-section experiencing a local sputtering flux density, related to local power density, exceeding the DAPVD threshold. Likewise, it is contingent on the portion exceeding the upper limit of local sputtering flux density, related to local power density, being within the bounds such that a desired DAPVD emission signature is maintained. Thus, an average density of the power applied to the cathode of the magnetron is controlled to be within the local maximums and minimums.

The lower DAPVD threshold limit may exist as a consequence of irradiation (particle bombardment) induced defect damage allowing surface or near surface atomic rearrangements that are conducive to the formation of the natural directionally emitting surface condition. An upper limit to applied power density could be determined as the applied power density which introduces sufficient defect density or may not allow sufficient relaxation of the materials surface and near surface atomic structure to allow restoration of the natural directionally emitting surface condition. For example, nominal average densities of power applied to the cathode typically include a range of at least 10 W/sq. cm to the upper limit or at least 20 W/sq. cm to the upper limit. However, as stated, these are nominal limits dependant upon the target material and cathode design features and are thus intended as an indication, not as absolute values.

For example, in some systems a power density of as much as 100 or 300 W/sq. cm may be employed.

Surface Condition

Another factor to consider is initial surface condition. Due to the surface nature of the sputter effect, initial surface condition is important. It can be the case, for a poorly prepared initial surface on a directional target material, that directionality may not be induced even after prolonged sputtering. There appears to be a threshold tolerance for surface condition that is difficult to overcome even by prolonged sputter erosion, as the act of sputter erosion itself can then tend to perpetuate a non-directional surface condition. Generally, initial surface finish should be better or close to the dimensions of the "natural" surface topology as described above.

In the examples shown herein, the pre-sputtering surfaces of "machined" targets had a grooved finish close to the topographical dimensionality of the "natural" surface topology. Machined grooves were typically less than 20 microns deep, approximately 100 microns wide, forming angles of ~20 degree to the surface plane. "Polished" targets had a pre-sputtered mirror finish to better than 1 micron. Similarly "diamond turned" surfaces had a pre-sputtered mirror finish to better than 0.04 micron.

Magnetron Cathode (Magnet and Target) Design

Numerous magnet designs have been proposed to tailor the "shape" of the racetrack plasma and resultant sputter erosion groove in attempts to improve deposition uniformity and/or target utilization from sputter magnetron sources. Including, for example, the use of shunts and/or shaped poles, etc. Static magnetron devices may also employ motion of the substrate with respect to the sputter source.

State of the art magnetron designs utilize magnet assemblies that move the racetrack plasma over the target surface with the substrate often static. A popular example of the latter is the scanning spiral type. However, the scanning spiral magnetron still can produce an undulating macroracetrack topology over the target surface.

A linear scanning magnetron device is an important preferred element of this invention. It can be used to sputter material uniformly and incrementally in each sweep without the development of a macroracetrack groove over the target region used to effect deposition at the substrate. Linear scanning magnetrons in general are known in the art. See U.S. Pat. No. 5,298,137 to Marshall, III, U.S. Pat. No. 5,328,585 to Stevenson, et al., and U.S. Pat. No. 5,873,989 to Hughes, et al., all of which are incorporated herein by reference.

In practical application, a magnetron action should be developed to produce uniform emission from the target. In linear scanning systems, by virtue of the integrating effect of repeated linear scanning, the cross-sectional plasma (ion) density needs to be only consistent, not necessarily uniform, in contrast to static magnetron systems. Design or knowledge of the detailed shape of the plasma volume accordingly produced in a given process by the design of the crossed electric and magnetic field of the magnetron, is not essential to produce a materials controlled directional uniform flux.

In the present invention, linear scanning refers to a constant velocity of the magnetron as it sweeps over the area of target whose sputter emission will produce deposition on the substrate. This will be closely coincident with that of the substrate in directionally emitting systems. A suitable, minimized scan overshoot, of the magnetron, beyond the edges of the deposition region but before the "dwell" regions, may be employed. By employing this overshoot, a directional sputtered flux, possibly combined with suitable shielding, would be expected to minimize or negate undesirable "end-effects" on deposited film uniformity. Note in addition for uniform deposition, a planar rectangular magnetron configuration, for example, requires a consistent cross-sectional plasma profile (ionization density) longitudinally, i.e., over the substrate coincident deposition producing lengths of the plasma conduits. Ideally, the field design should produce intense narrow width "line" sources with normal or near normal incidence of sputtering particles incident at the target surface. Note that, for example, in rectangular magnetron systems, scaling of the system is readily possible for a broad range of substrate sizes. The technique would be particularly advantageous for large area substrates, e.g., 300 mm Silicon wafers and Flat Panel Display substrates.

In further practical considerations of magnetron design, development of a macroscale erosion groove will normally change plasma impedance. Impedance changes because typically the magnetic flux distribution available to assist gas phase ionization will be effectively altered through the act of target materials erosion. Correspondingly, this dynamic process affects the spatial distribution of ionizing electrons in the racetrack zone and therefore the source density and distribution of sputtering ions and thereby the emission intensity profile of sputtered particles. Although macro racetrack groove development is avoided (over the area of target active in "wafer" deposition in the present invention) in a linear scanning technique, the magnetic field must be consistent above the target to avoid compensating for variation in emission intensity as the target erodes. This may be accomplished, e.g., by designing the magnetic field to be sufficiently uniform above the target and in the evolving space produced by target erosion or alternatively the magnet assembly can be retracted in synchronism with the erosion rate. Or this may be accomplished by the use of a dynamically varying magnetron system using a variable field generated through, e.g., electro-magnets.

Potential variation in emission (deposition) intensity can also be compensated for through the scanning action of the "line" sources forming the rectangular (or square) planar magnetron and power applied to the target. The scan speed and/or power applied to the cathode may be constant or it may be varied as a function of magnetron position to control uniformity of the deposited film. From geometrical considerations of deposition uniformity, the "line" sources should be approximated by narrow width sources relative to the dimensions of the substrate and slightly longer than the substrate width to compensate for end effects. A narrow magnetron is also preferred to minimize the extent of target overshoot relative to substrate dimensions.

The following describes basic elements of a practical sputter cathode utilized in the present invention. This description is neither definitive nor intended to limit the scope of the present invention with respect to the cathode design. Generally a suitable cathode may comprise a target assembly and a rectangular magnetron (magnet assembly). The magnetron is connected to a drive assembly and capable of computer controlled motion (as previously described). The magnetron is situated in a controlled vacuum environment (Housing). In turn, the magnetron is situated behind a target heat exchanger assembly. The magnetron's spatial disposition, distance from and orientation, with respect to the electrically insulating back plate of the heat exchanger assembly is variable.

This contrasts with conventional systems, often including linear scanning systems, that undesirably situate the magnetron in cooling water. The situation in cooling water can lead to corrosion of the typical magnet materials, undesirable deposits forming on the magnet poles (potentially impacting the magnetic field characteristics), impeding the magnetron's motion and, importantly, a high pressure differential, essentially that of atmospheric, existing across the target assembly.

In the cathode of the present instant invention, the target assembly comprises a sputter target assembly, that is a sputter target and backing plate, mechanically and thermally coupled to the heat exchanger assembly. The heat exchanger assembly maintains the target below temperatures at which thermally induced crystallographic textural changes can occur. In-situ monitoring of target temperature may be used. The sputtering face of the sputter target is exposed to the environment of a process chamber and surrounded peripherally by a dark space shield assembly, which may also be utilized as a chamber liner. In operation, a pressure differential exists between the magnetron housing and the process chamber.

The magnetron housing is typically at a greater pressure (Pmh) than that of the thin film sputter process chamber (Pproc), sufficient to prevent formation of a secondary plasma and arcing between the magnetron magnet assembly and the rear face of the heat exchanger or backing plate depending on cathode configuration. A pressure differential exists between the magnetron housing and process chamber. However, the pressure differential is low because low pressures are employed in both the process and magnetron enclosures. Thus, the target assembly experiences very low stresses resulting from the pressure differential. This permits the use of relatively low strength backing plates and target to backing plate bonding. The target and backing plate may be of monolithic construction (target and backing plate fabricated from a single piece of material).

This low pressure differential is advantageous. In conventional systems, often including linear scanning systems, the target typically experiences almost an atmospheric pressure differential between the magnetron housing and process chamber, which requires very strong backing plate materials and target to backing plate bonding to maintain the vacuum integrity of the process chamber and prevent bending and warping of the target assembly during sputtering. The effects of target bending/warping on sputtered film characteristics are serious problems in large target designs and high end interconnect applications. For example, 300 mm cathodes in semiconductor interconnect applications, require very heavy, cumbersome target assembly designs. Further, it is often the case that undesirable mechanical forces and temperature differences are applied to the sputter target material during manufacture of the target assembly. The fabrication processes are also relatively costly. If high mechanical strength of the target assembly is not required, processes involving low strength materials, low temperature bonding and low mechanical forces can be used to fabricate the target assembly design of this instant invention. This prevents undesirable thermal, mechanical and thermomechanical induced changes to sputter target texture and microstructure critical to the invention. For example simple, low temperature indium bonding could be utilized to join the target and backing plate with very little applied load in the process.

Figure 17:
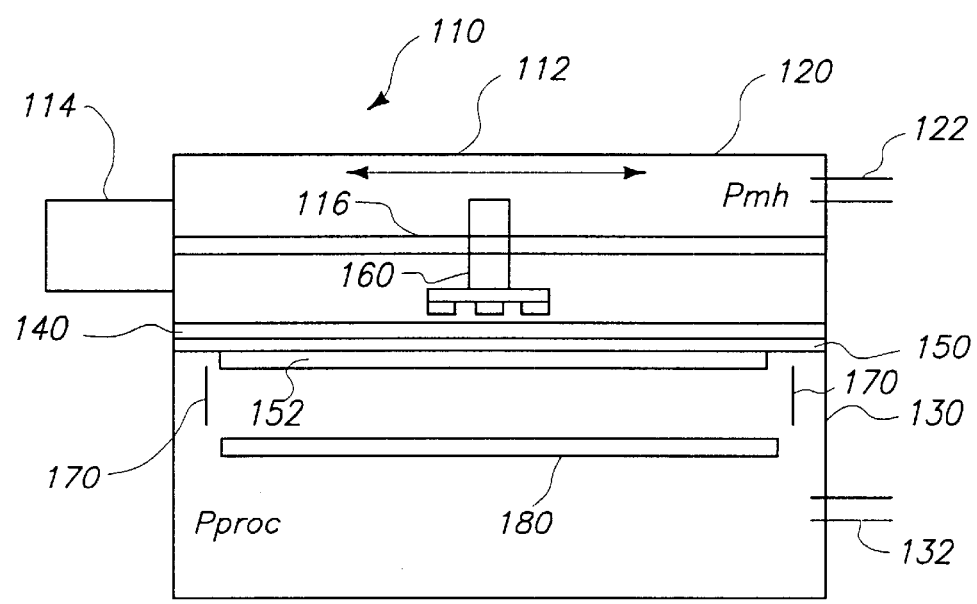
FIG. 17 shows a schematic diagram of an embodiment of a magnetron used in the present invention.

FIG. 17 shows a schematic diagram of a magnetron sputtering device of the present invention. In FIG. 17, the linear scanning magnetron sputtering device 110 has a drive motor 114, a drive screw and rail assembly 116, a magnetron vacuum housing enclosure 120 at pressure Pmh fed by gas through a port 122, and a process chamber enclosure 130 at pressure Pproc fed by gas through a port 132. The magnetron vacuum housing enclosure 120 and process chamber enclosure 130 are separated by a target heat exchanger assembly 140 and a target 152 and backing plate assembly 150. A scanning magnetron assembly 160 is located within the magnetron vacuum housing enclosure 120. A dark space shield/chamber liner assembly 170 and a substrate 180 are located within the process chamber 130.

Typically, the process chamber contains gas comprising a member selected from the group consisting of Ar, Kr, Ne, Xe, oxygen, nitrogen, hydrogen, methane, acetylene, hydrogen sulfide, carbon dioxide, carbon monoxide and mixtures thereof. The pressure within the process chamber is lower than the pressure within the housing of the magnetron and the pressure within the housing of the magnetron is at most 200 millibar above the pressure within the process chamber. Typically, directional arrival is maintained at process pressures of the gas of at most $1\times10^{-2}$ mb. Also typically, the magnetron is capable of maintaining directional emission for a continuous target use of at least $5\times10^{-5}$ kwhrs.

Ballistic Sputtered Particle Transport and/or Low Angle Transport

To maintain the beneficial effects of directional, uniform target emission characteristics upon arrival of the sputtered particles at the substrate it is another important element of this invention that sputtered particle transport from the emitting target surface to the substrate is essentially ballistic. That is, angular perturbations from the emission trajectory of target sputtered particles through collisional interaction with gaseous species in the process chamber and/or between sputtered particles are minimized. In practical circumstance, positioning the substrate at a distance less than or equal to the "process free path of the particles" (PFP) generally sufficiently fulfills this criteria.

Compensation should also be included if target erosion increases the target to substrate distance. Mechanical devices can be included to compensate, i.e., maintain a constant target to substrate distance, through appropriate motion of the substrate table or cathode assembly.

In practical consideration of transport effects, generally the majority ballistic transport component will be accompanied by a low angle transport component. "Low Angle Transport" is defined as the circumstance wherein only a few, low angle scattering events occur during transport such that the particle may still be incident with sufficient directionality. A low angle transport mode is more likely to occur practically in the case of a high mass sputtered species or in the general case for sputtered particles in the low energy tail of the emitted velocity (energy) distribution.

For a given sputtered particle species, the Mean Free Path (MFP) (see, e.g., Vossen, J. L., Kern, W., Thin Film Processes, Academic Press (1978)) is a function of the sputtered particles kinetic energy, charge state and various process conditions, e.g., the nature, composition and pressure of the specie(s) forming the gaseous phase and its temperature. Detailed transport calculations can be made, for example using the SIMBAD computer code (SIMBAD Users Manual, T. Smy and S. K. Dew (1994); SIMBAD copyrighted software, marketed by the Alberta Microelectronics Centre, #318, 11315 87 Avenue, Edmonton, Alberta, Canada, T6G 2T9) which is one of many well known in the art, and measurements of emitted particle energetics enable an acceptable "maximum" target to substrate distance to be estimated for given sputtering conditions. This distance is in effect a "process free path" below which the majority of particles enjoy ballistic transport across the target—substrate space. The inventors measurements on a variety of targets at various conditions, e.g., applied powers, sputter gases, etc., have shown typical energy distributions of sputtered particles are single—peaked distributions or multi-peaked, e.g., 2 or 3 peaked, distributions.

Generally, but not exclusively, peak maxima of as-emitted sputtered particles occur approximately in the range 5–15 eV under typical sputter conditions. A practical compromise can often be reached by operating at sufficiently low sputtering pressures to give a "PFP" sufficient such that only a small proportion, say arbitrarily less than 5%, of the lowest energy particles in the energy distribution suffer collisional transport. Low process pressures have other benefits in that it is also desirable that sputtering ion transport across the cathode sheath will be collisionless. Collisionless transport maintains the trajectory, charge state, and cathode fall derived kinetic energy of the sputtering particles at a near normal sputtering incidence angle. This is important because the orientation of the emission distribution can be dependent on the angle of incidence of the sputtering particles (See for example Wasa, K., Hayakawa, S., Handbook of Sputter Deposition Technology, Noyes Publications, 1992.

Generally, even high mass species such as sputtered Gold atoms emitted with energies greater than 2 eV will have a PFP greater than approximately 3 cm in room temperature Ar at $7.5 \times 10^{-4}$ mb. Lower mass species will have greater PFP's under these conditions. For example Aluminum, Copper and Titanium will have PFP's of the order of 4 cm or greater for particles whose emitted sputter particle kinetic energy is in excess of 2 eV (1 eV for Aluminum) in room temperature Ar at $1 \times 10^{-3}$ mb. For directional PVD these are acceptable conditions to allow a practical target to substrate distance (which will be less than the PFP except for the case if all particles were at normal angle of incidence (90 degrees to the substrate surface)) for a deposition process and stable magnetron sputter cathode operation. Lower pressures will increase the PFP and increased PFP may offer practical advantages in system design. Practically, a compromise is determined through considerations of plasma—substrate interactions, cathode design and operational constraints and process efficiency.

Advantages

Knowledge of the "PFP", coupled with intrinsic emission directionality, allows the present invention to employ a target to substrate distance significantly less than that required by the long throw technique. Accordingly, the present technique does not suffer the extent of flux attenuation and asymmetry intrinsic to the long throw method, nor require relatively higher sputtering powers to compensate for the reduced flux intensity. See, Rossnagel, S., J. Vac. Sci. Tech. B., Vol.16, No.5, p. 2585 (1998). Indeed, aided by directionality, the point to point emitted flux intensity is largely preserved at the substrate. This is a significant processing advantage. Operationally and economically the process would intrinsically be expected to be more efficient than long throw techniques and non-directional linear scanning magnetron deposition.

Controlling the substrate incident angular distribution (IAD) of sputtered particles on the substrate in the manner of the present technique also avoids the process complexities associated with a secondary ionization stage, electrostatic deflection and film resputtering which are the basis for producing "conformal" coverage or a fill process in ionized PVD (I-PVD) techniques. See, Rossnagel, S., J. Vac. Sci. Tech. B., Vol.16, No.5, p. 2585 (1998). Generally only a small, fraction of the incident particle flux in the present technique has sufficient energy to cause re-sputtering. In contrast to I-PVD, the process and equipment are a return to simplicity with easy scale-up or down depending on wafer size. Unlike the prior art, the present invention could fill or conformally cover features on the substrate having an aspect ratio of at least 3, typically 3 to 12, and a critical dimension of 0.10 micron or less (for example, 0.05 to 0.10 micron). Conformal coverage is defined as step coverage, wherein the thickness of the thinnest portion of the film covering a step feature is at least 15% of the thickest portion of the film covering that feature. Preferably, the thinnest portion of the film covering the step feature is at least 20% of the thickness of the thickness of the thickest portion of the film covering that feature. Of course, the present invention could achieve step coverage of features which have lower aspect ratios and/or larger critical dimensions.

Likewise, the present method could avoid the keyhole defect when filling a trench, e.g., channel or via, of a substrate, wherein the channel or via has a depth to width aspect ratio of at least 3, typically 3 to 12, wherein the critical dimension is 0.10 micron or less (for example, 0.05 to 0.10 micron). In other words, the present invention could completely fill a channel or via without forming a void below the film in the channel or via even when the channel or via has a critical dimension of 0.10 micron or less, and may not require a reflow step. Of course, the present invention could completely fill trenches having lower aspect ratios and/or larger critical dimensions.

The technique may also yield benefits in improved target utilization and reduced target sizes with particular cost benefits in scale with large area substrates, dependant on geometry. The benefits of this directional emission technique can be extended through, e.g., deposition with angularly dispersed cathodes, angularly displacing the substrate with respect to the IAD normal with or without substrate motion, or physical collimation of selected IAD components in a multipeaked IAD, etc.

This technique may also be utilized as a low pressure I-PVD technique. Utilizing the cathode emits directionally sputtered particles as ions to remove the requirement for a secondary ionizing plasma and high process pressure, as used in the current art. (The secondary plasma is related to much of the process complexity and limitations of the current I-PVD art). The benefits of substrate electrostatic deflection with or without resputtering could then be employed if desired. An example of such a directionally emitting ionized particle flux from a magnetron is shown in the examples herein. The neutral flux component was typically less than a few percent of the emitted sputtered particle flux.

An unexpected advantage of the present invention is to provide a magnetron IPVD technique without a secondary plasma. In other words, the directional sputtering magnetron and/or target of the present invention, at least in some instances, naturally produces charged metal particles, possibly through a condition of magnetron balance, space-charge or localized high magnetic field intensity. This produces charged metal particles without the complexities associated with sputtering through a secondary plasma.

Optional Techniques

If desired, the cathode may be "rocked". This is mechanically oscillating the cathode about its axis. This alters the effective angle of incidence rather than limiting the angle of incidence to that provided by the geometry afforded by the emission profile.

Another possibility is to employ a collimator. A collimator is a mechanical device, like an open honeycomb, placed between the cathode and the substrate. The collimator acts as mechanical apertures which block unwanted high angle flux components. The present technique produces enhanced low angle flux components relative to conventional techniques. Thus, sputtering collimators could be utilized if required with only a small effect on process efficiency relative to their effect in conventional use and could be of relatively open structure.

Cathode multisourcing is another technique and is defined as having a series of cathodes disposed at various angles and deposition rates with respect to the substrate, and may be utilized, for example, to produce a series of super imposed IADs to achieve a desirable integrated IAD.

Statically adjusting the angle of the cathode is another technique which may be employed.

The invention will now be described by the examples intended to illustrate, but not limit, the scope of the invention.

EXAMPLES

In Examples 1–10 and 12–16, targets were dc sputtered in Ar @<1.5*10$^{-3}$ mb using conventional rectangular planar magnetron cathodes. Example 11 illustrates sputtering in Kr at <1.5*10$^{-3}$ mb using a conventional rectangular planar magnetron cathode. Examples 17 and 18 utilize a linear scanning magnetron cathode. Single crystal samples had a diamond turned mirror surface finish (<0.05 micron) prior to sputtering with the exception of Tantalum which was chemo-mechanically polished to a mirror finish (<1 micron).

Small targets, e.g., single crystals, were mounted centrally in the racetrack region in a target mount assembly. The target mount was of a different material. Polished targets had a pre-sputtered mirror finish to better than 1 micron. The surfaces of "machined" targets, prior to sputtering, had a grooved finish close to the topographical dimensionality of the "natural" surface topology. Machined grooves were typically less than 20 microns deep, approximately 100 microns wide, forming angles of ~20 degree to the surface plane. Unless stated otherwise, approximately 10 microns of material was removed by sputtering prior to data collection.

Profilimetry data was acquired using spatially resolving thin film aperturing techniques or mass spectrometry with energy filtering. A PFP (Process Free Path), i.e., a data collection distance of <3.5 cm was used, unless stated otherwise for both techniques. Spatially and angularly resolved data of sputter particle intensity distributions were collected either as that integrated over the full hemisphere of target emission or sputtered particle arrival at the "substrate" data or similarly profilimetry data were collected for selected cross-sections as planes within the emission/arrival hemisphere. Data for the selected cross-sections as planes was measured within ±57 degrees from normal (0 degrees) unless shown otherwise. Unless otherwise stated, data was taken for emission/condensation for sputtered particles originating from, or close to, the region of maximum emission from the racetrack.

In Examples 1a and 1b, a macroracetrack of up to approximately 1 mm maximum depth was developed prior to analysis. In all other examples no significant target macroracetrack topology was allowed to develop.

Examples 1a and 1b

Figure 1B:
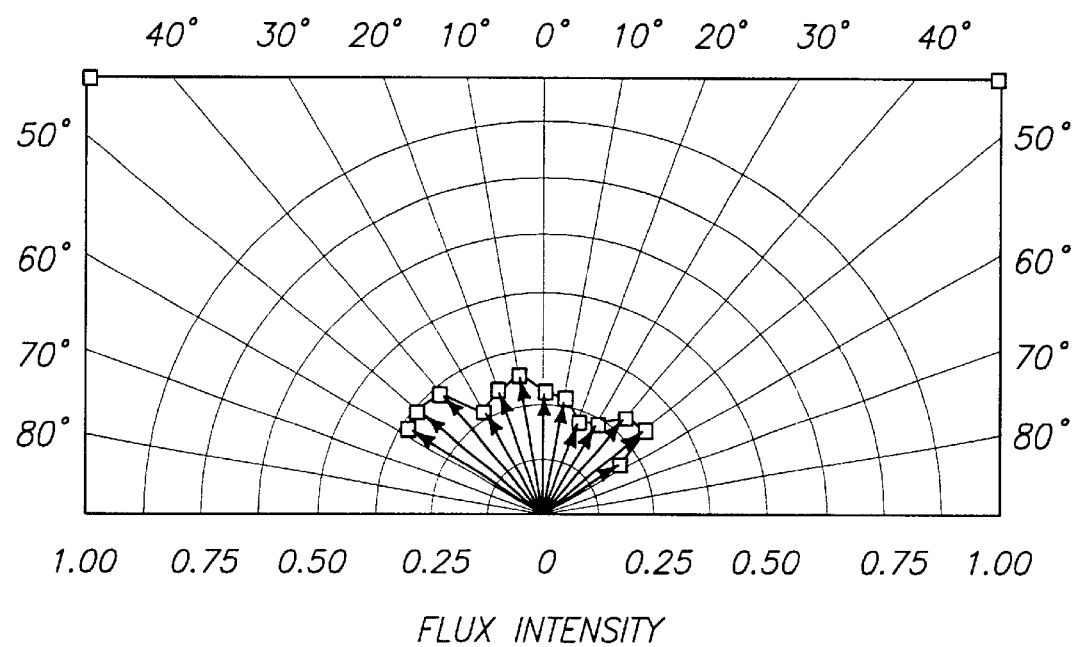

FIGS. 1A and 1B show the data, of Examples 1a and 1b, in spatially resolved, plane section non-directional sputter emission profiles from (100) and (110) textured polycrystalline Aluminum sputter targets, respectively. This illustrates non-directional behavior of the emission response given for a sufficiently developed macroracetrack. The textured Aluminum polycrystalline targets are targets in which the dominant orientation of the crystal grains is where the <100> or <110> directions, respectively, are normal to the unsputtered target surface. The targets had a machined finish prior to sputtering. The target of Example 1a had a (100) texture with an estimated reduced pole figure MRD of less than 8, and an estimated grain size less than 125 microns. The target of Example 1b had a (110) texture with an estimated reduced pole figure MRD of 5.9, but its grain size was indeterminant in this deformation microstructure.

Example 2

Figure 2:
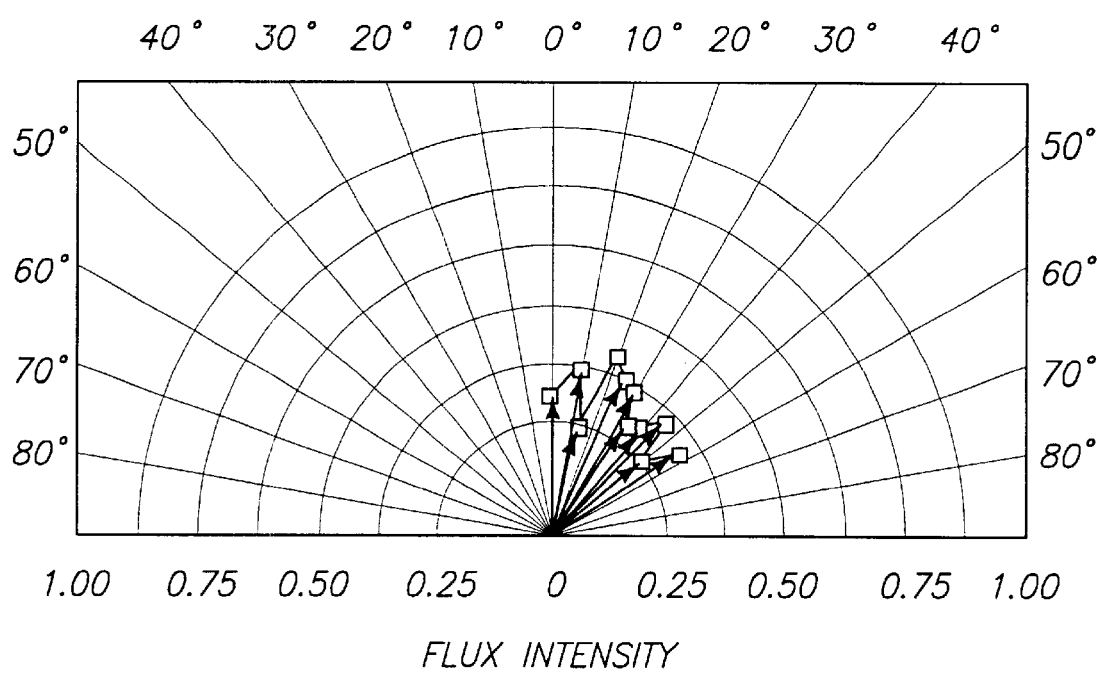
FIG. 2 shows an integrated, full hemisphere, spatially resolved, non-directional sputter emission profile from a commercial polycrystalline Titanium target.

An integrated, full hemisphere, spatially resolved, non-directional sputter emission profile from a commercial polycrystalline Titanium target (ALTA Alpha Ti) was obtained and is shown by FIG. 2. An integrated, full hemisphere emission profile is one in which looks at the integrated emitted sputtered particle flux as a function of emission angle collected over a complete hemisphere above the target rather than in plane section as in FIGS. 1a and 1b. The target had a (103) texture with a reduced pole figure MDR of 6.1, a grain size less than approximately 20 microns, and a machined finish prior to sputtering.

The emission response from contemporary sputter targets under non-directional conditions is generally variable through target life.

Examples 3a–3c

Figure 3A:
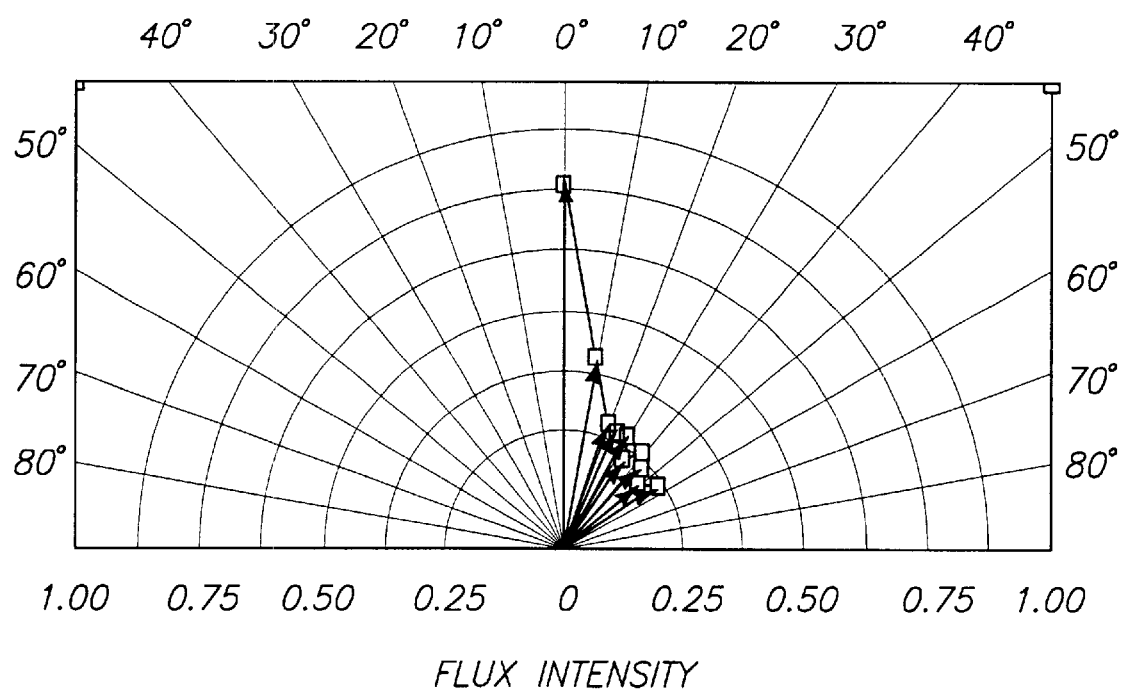
FIGS. 3A and 3B, show for Copper and Aluminum, respectively, typical, spatially resolved, high resolution integrated, full hemisphere, directional emission profiles from single crystals whose <110> direction is normal to the surface plane of the crystal.
Figure 3I:
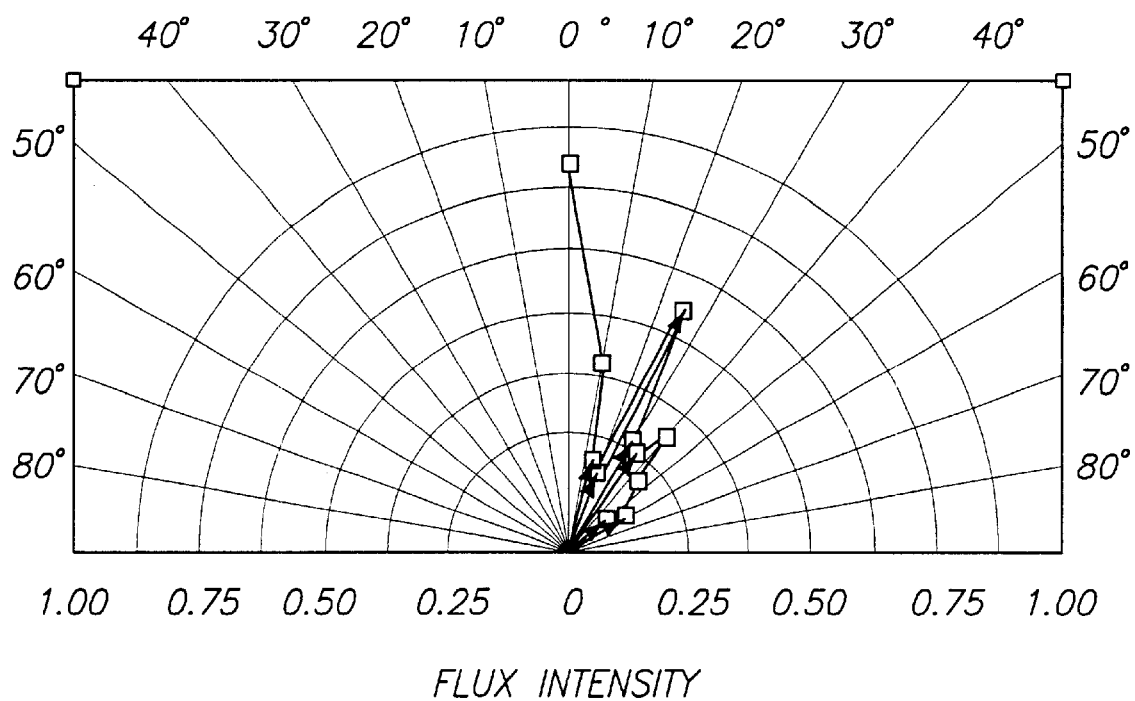
FIG. 3C shows a spatially resolved, plane section directional emission profile from single crystal Tantalum whose <111> direction is normal to the surface plane of the crystal.

The data of Examples 3a and 3b, are shown in FIGS. 3A and 3B, respectively. FIGS. 3A and 3B show for Copper and Aluminum, respectively, typical, spatially resolved, high resolution integrated, full hemisphere, directional emission profiles from single crystals whose <110> direction is normal to the surface plane of the crystal. The target samples were from Goodfellow Metals, UK supplied polished.

The profile of FIG. 3A was produced from a diamond turned surface with no intentional sputter pre-conditioning. The profile of FIG. 3B was produced after several tens of microns of material had been removed from the original diamond turned surface which also initially exhibited directionality without intentional sputter pre-conditioning. The profiles of FIGS. 3A and 3B would be expected to produce excellent base and sidewall coverage in coating high aspect ratio via structures using the PVD deposition technique described herein.

Figure 3C:
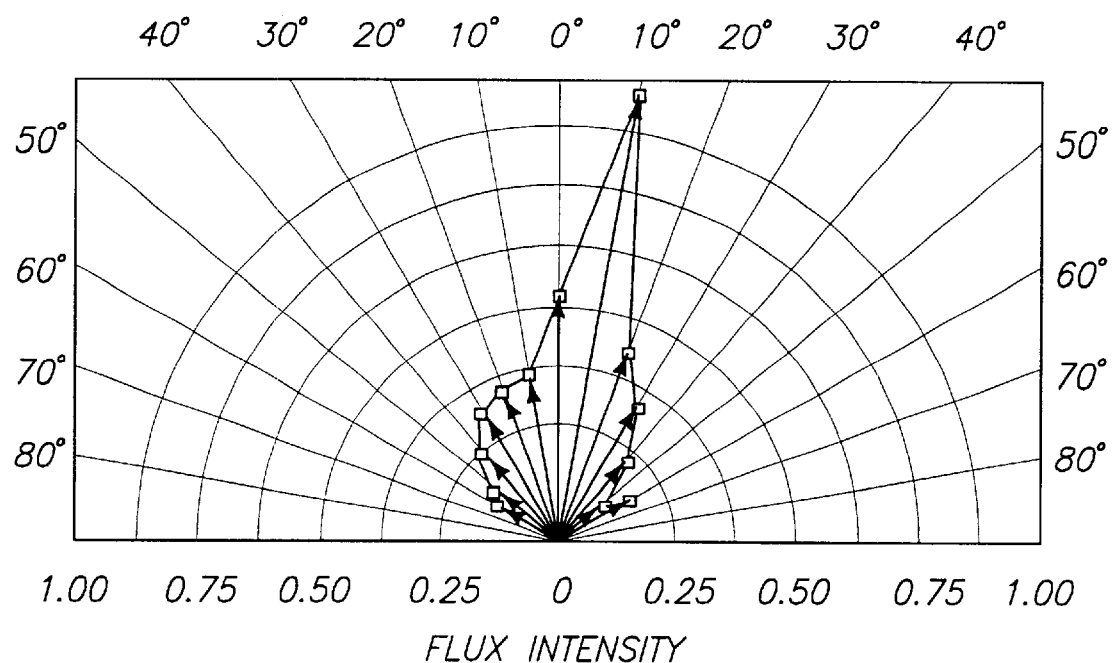

The data of Example 3c is shown in FIG. 3C. FIG. 3C shows a spatially resolved, plane section directional emission profile from single crystal Tantalum whose <111> direction is normal to the surface plane of the crystal. The target sample was from Goodfellow Metals, UK supplied polished.

Examples 4a–4c

Figure 4A:
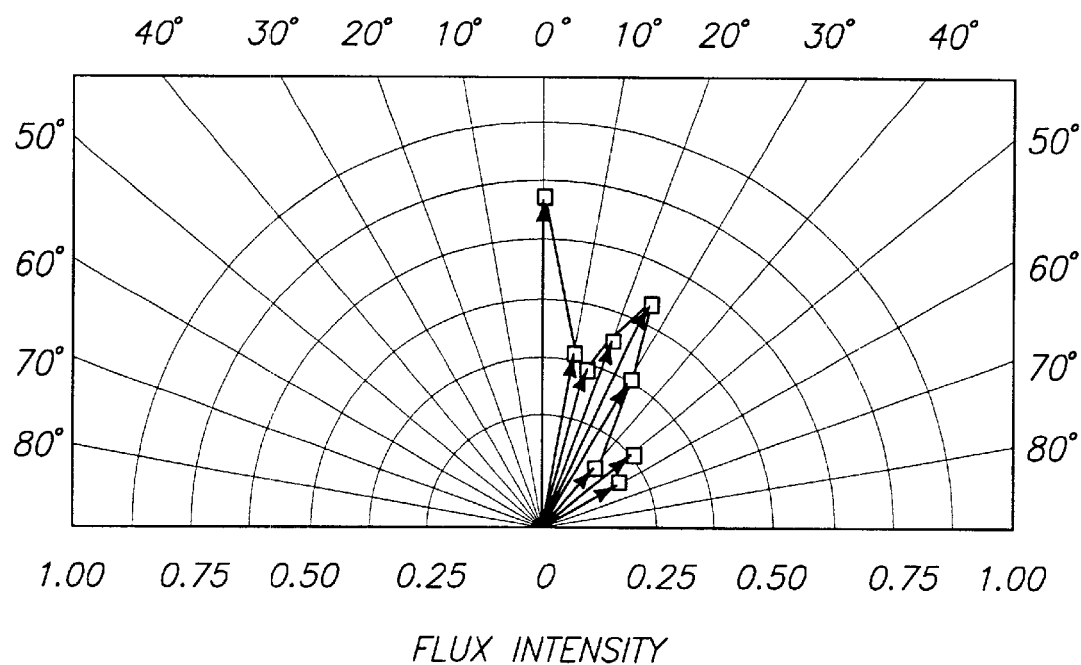
FIGS. 4A–4B show for Aluminum and Copper respectively typical high resolution, spatially resolved, integrated, full hemisphere emission profiles from highly textured polycrystalline sputter targets whose <110> direction is normal to the surface plane of the target.
Figure 4B:
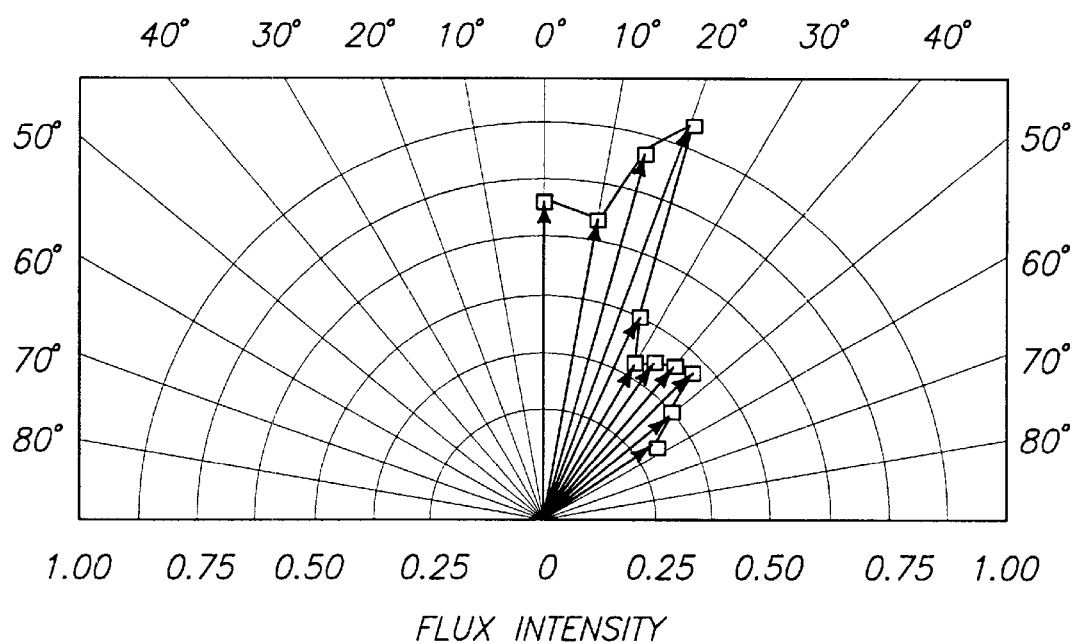
Figure 4C:
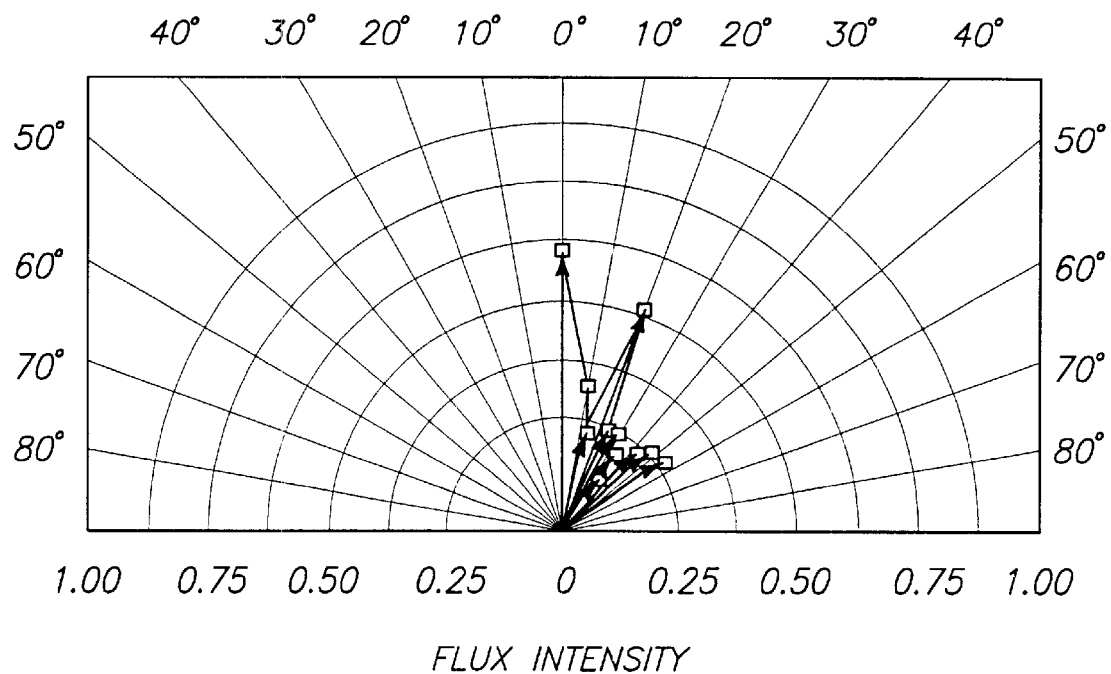
FIG. 4C shows for Titanium typical high resolution, spatially resolved, integrated, full hemisphere emission profiles from highly textured polycrystalline sputter targets.

The data of Examples 4a–4c is shown in FIGS. 4A–4C. FIGS. 4A–4C show for Aluminum, Copper and Titanium respectively, typical high resolution, spatially resolved integrated full hemisphere emission profiles from highly textured polycrystalline sputter targets. The Aluminum and Copper specimens have a <110> direction normal to the surface plane of the target.

The target of Example 4a had a (220) texture with a reduced pole figure MRD of 10.2, but its grain size was indeterminant in this deformation microstructure. The target of Example 4b had a (220) texture with a reduced pole figure MRD of 18.2, but its grain size was indeterminant in this deformation microstructure. The target of Example 4c had a (103) texture with a reduced pole figure MRD of 12.1, and a grain size less than approximately 10 microns.

The profiles of FIGS. 4A and 4B were measured from a polished surface with no intentional sputter preconditioning. The profile of FIG. 4C is from the pre-sputtered surface of a similarly polished surface which also exhibited prior directionality without intentional sputter pre-conditioning.

These examples demonstrate directionality in polycrystalline target systems. Such profiles would be expected to produce excellent base and sidewall coverage in coating high aspect ratio via structures using the PVD deposition technique described herein.

Example 5

In-plane sputter emission data, shown in FIG. 5 was taken simultaneously in two orthogonal half planes (Profile A and Profile B) in section through the emission hemisphere fom the same directionally emitting region of a copper single crystal whose <110> direction is normal to the surface plane of the crystal. This illustrates directional, conal emission. The target sample was from Goodfellow Metals, UK supplied polished.

Examples 6a and 6b

Figure 6A:
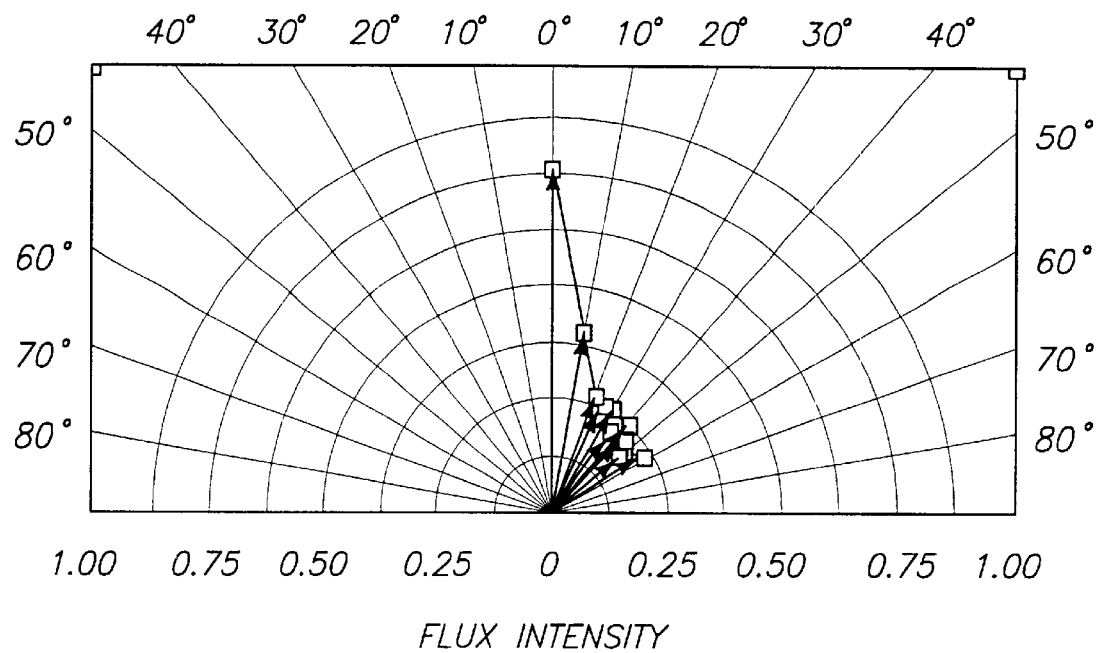
FIGS. 6A and 6B show consecutive, spatially resolved, high resolution, integrated, full hemisphere, directional emission profiles.
Figure 6B:
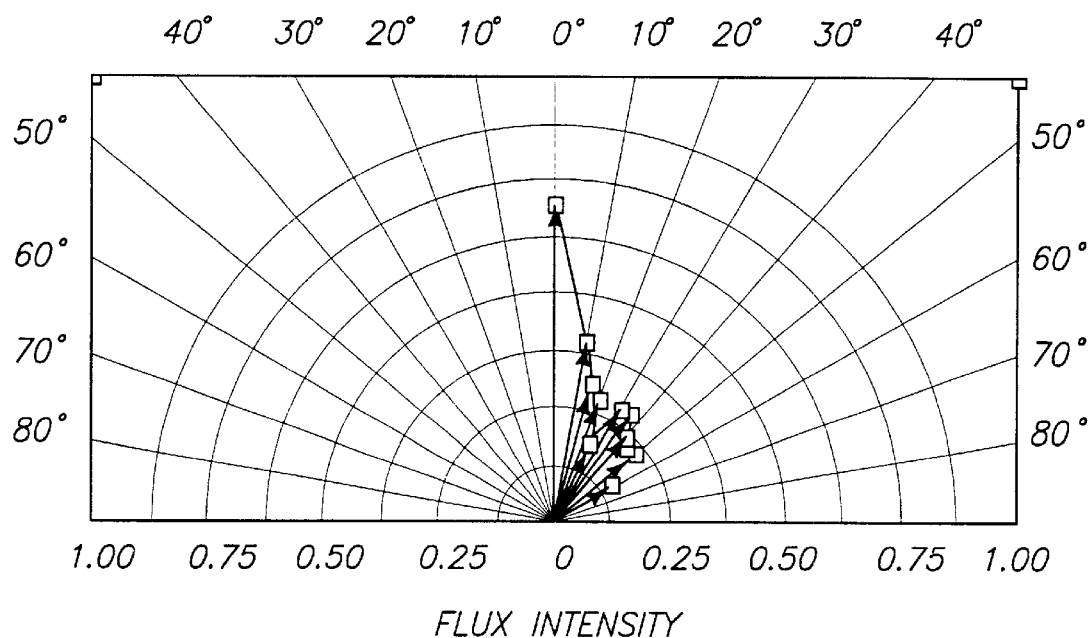

The data of Examples 6a and 6b are shown in FIGS. 6A and 6B. FIGS. 6A and 6B show spatially resolved, high resolution, integrated, full hemisphere, directional emission profiles from copper single crystals whose <110> direction is normal to the surface plane of the crystal taken over consecutive 1 hour periods. The intensity axes are directly comparable. Comparison of data in Example 6b with that of Example 6a illustrates that directionality can be maintained in ion irradiated material (sputter target) in this technique. The target samples were from Goodfellow Metals, UK supplied polished.

Examples 7a and 7b

Figure 7A:
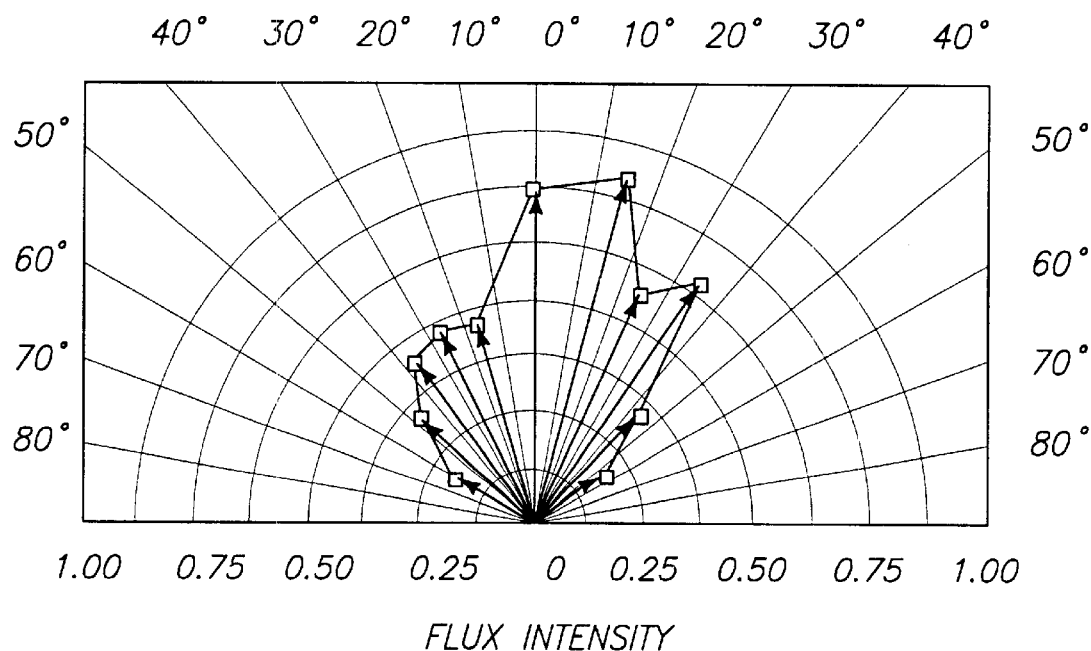
FIG. 7A shows spatially resolved, high resolution, integrated, full hemisphere emission profile.

The data of Examples 7a and 7b is shown in FIGS. 7A and 7B. In an analogous, experiment to Example 5, FIGS. 7A and 7B illustrate conditioning by sputtering can induce directionality. This illustrates the importance of surface condition in controlling the EAD. The target was a diamond turned, copper single crystal whose <111> direction is normal to the surface plane of the crystal. The target samples were from Goodfellow Metals, UK supplied polished.

FIG. 7A shows the integrated, spatially resolved, plane section emission profile over a 1 hour period taken after previous sputtering of the as-received diamond turned surface which had not exhibited a directional response.

FIG. 7B shows data collected from a consecutive sputter run, under identical conditions as Example 7a, from the same emitting surface region on the racetrack. This illustrates directional, conal, emitting lobes induced by prior sputter conditioning and maintained once attained.

Examples 8a–8c

Figure 8A:
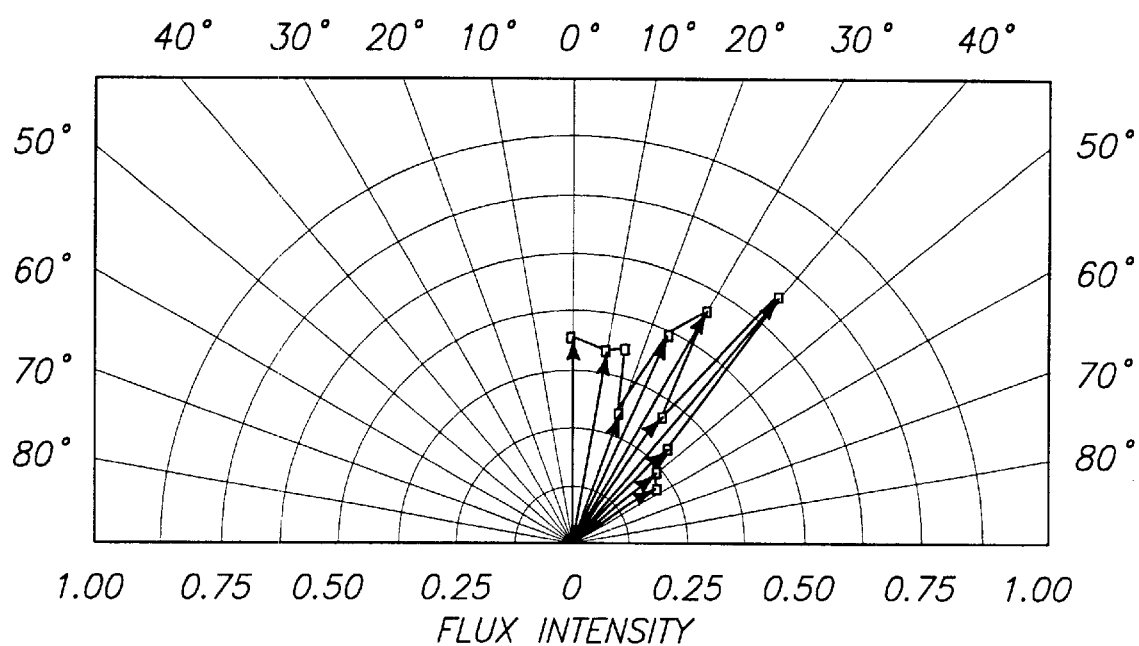
FIG. 8A shows spatially resolved, high resolution, integrated, full hemisphere emission profile.
Figure 8B:
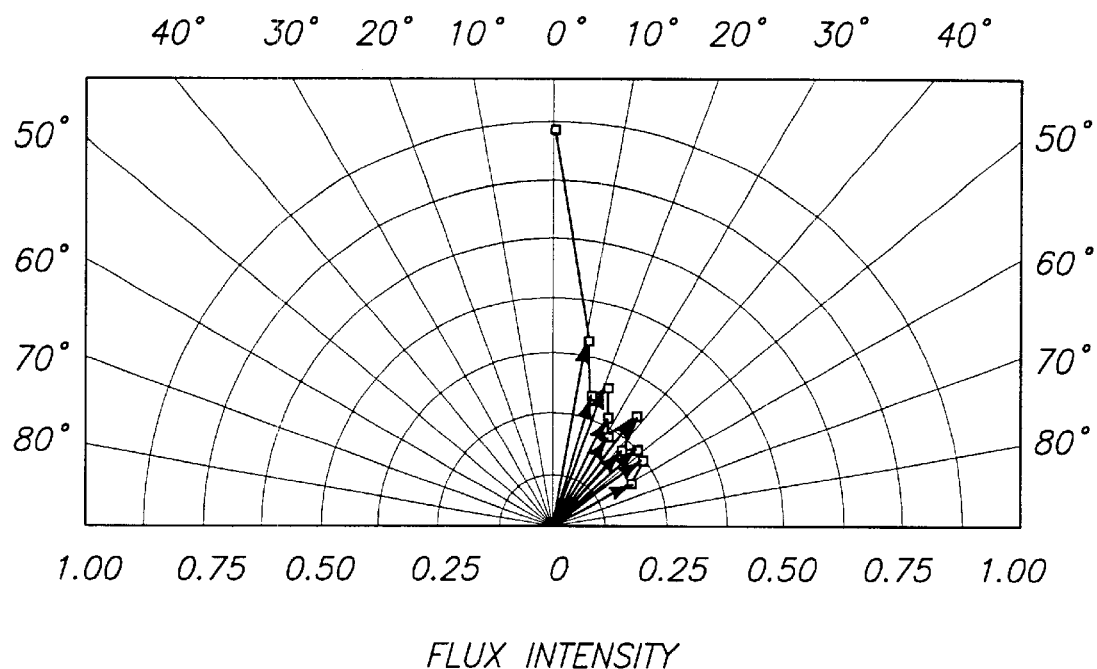
FIG. 8B shows spatially resolved, high resolution, integrated, fill hemisphere, directional mission profiles.

The data of Examples 8a and 8b are shown in FIGS. 8A and 8B. Examples 8a and 8b are a duplicate experiment to Examples 7a and 7b with the exception that the sputter target was a highly textured, polycrystalline AlCu0.5 alloy target with a machined surface finish prior to sputtering, whose <110> direction is normal to the surface plane of the target. The data are shown as spatially resolved, high resolution, integrated, full hemisphere emission profiles. The target of Example 8a had a (220) texture with a reduced pole figure MRD of 17.2, and grain size of 500–800 microns.

Figure 8C:
FIG. 8C is a cross sectional SEM micrograph.

The data of Example 8c is shown in FIG. 8C. FIG. 8C is a cross-sectional SEM micrograph illustrating the expected conformal film coverage over a 0.05 micron feature produced by the deposition technique from the conditioned target from Example 8b.

Example 9

The data of Example 9 is shown in FIG. 9. FIG. 9 illustrates directional emission as a function of power applied to the sputter target. The actual average applied power densities employed are 1.5 W/sq. cm and 5 W/sq. cm. Thus, the ratio of power densities between the data sets was 3.33. In the examples, the nominal power density assumes a nominal projected racetrack area for comparative purposes. Data are plane section emission profiles. This illustrates directionality was not significantly affected by power in the high emission density region of the racetrack. The target was a copper single crystal whose <110> direction is normal to the surface plane of the crystal. The target sample was from Goodfellow Metals, UK supplied polished.

Examples 10a and 10b

Figure 10A:
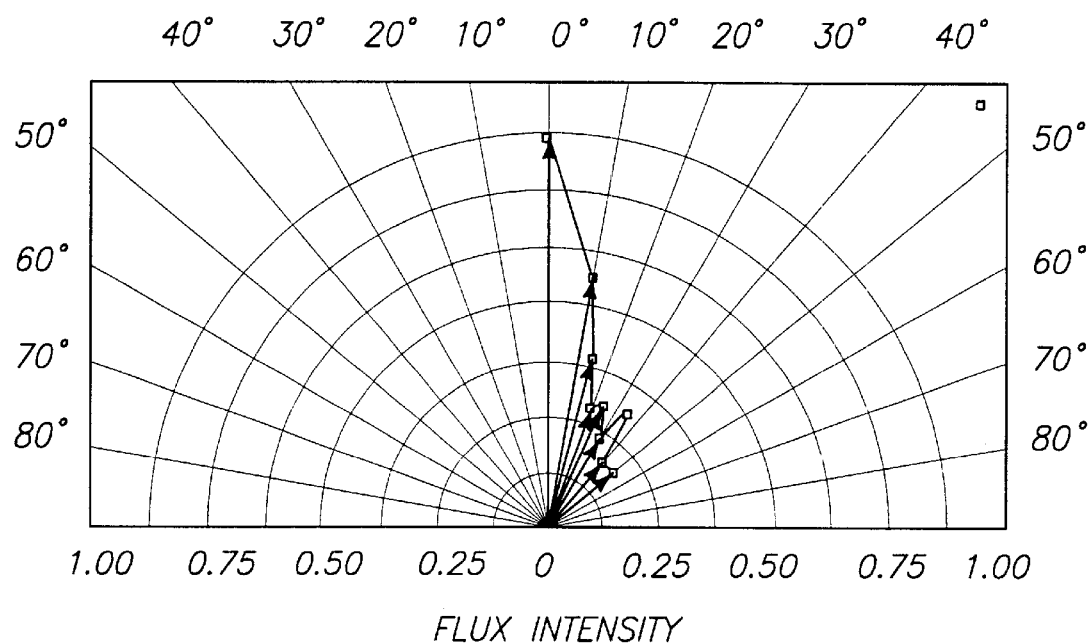

The data of Examples 10a and 10b are shown in FIGS. 10A and 10B. FIGS. 10A and 10B are spatially resolved, integrated, full hemisphere, emission profiles taken near the racetrack center and near the racetrack edge, respectively. They, illustrate that, under conditions for directionality as described above, directionality is maintained over the width of the racetrack plasma profile and therefore over a wide range of both sputtering particle bombardment intensities and sputtering particle emission intensities. Therefore, there was sufficient power density across the racetrack cross-section to obtain directional emission and minimize high angle components. The target was an Aluminum single crystal whose <110> direction is normal to the surface plane of the crystal. The target samples were from Goodfellow Metals, UK supplied polished.

Example 11

The data of Example 11 is shown in FIG. 11. FIG. 11 illustrates directional emission produced by sputtering in Krypton gas. Data are plane section emission profiles. The target was a copper single crystal whose <110> direction is normal to the surface plane of the crystal. The target sample was from Goodfellow Metals, UK supplied polished.

Examples 12 and 12a

Example 12, studies the relative flux intensities of monovalently charged, positive Copper ions and Copper neutrals arriving at 0 degrees. The particles are simultaneously emitted and originating from the same region of a (110) single crystal sputter target in the embodiment of the present invention employing the directional ionized PVD technique. FIG. 12A shows the data for Example 12 that indicates these relative flux intensities and the general features of the energy distribution function of sputter emitted particles for the purposes of substantiating the basis of a PFP. However, the energy distributions of emitted sputtered particles are dependent on many factors and may deviate substantially from the example shown. The target sample was from Goodfellow Metals, UK supplied polished.

Figure 12B:
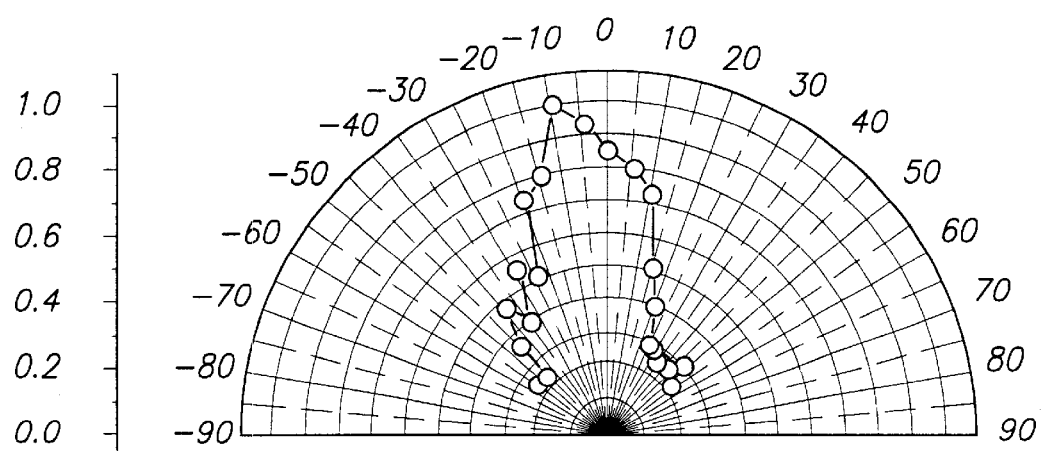

Example 12a, collects data for a plane section, directional arrival profile of positive copper ions produced from Argon sputtering of the Copper (110) single crystal in Example 12 above. The data is shown by FIG. 12B. The ion flux was produced without the use of a secondary plasma. The target sample was from Goodfellow Metals, UK supplied polished.

In Examples 13a–15 the targets were magnetron sputtered in Argon at <$1.5 \times 10^{-3}$ Mb. The surfaces of each target were prepared prior to sputtering and sputter conditioned as described in the above examples. A PFP of <5 cm was used throughout.

Examples 13a and 13b show typical reduction in the relative intensity of high angle arrival (thereby emission) components to low angle components in (110) crystallographically textured copper target material, produced by an electrochemical deposition (ECD) technique, with increasing applied power to a magnetron cathode.

The electrochemical deposition technique endeavors to electro-form a columnar, crystallographically orientated deposition structure. The technique employs an electrochemical cell containing up to 35 oz/gal $H_2SO_4$ and 32 oz/gal $CuSO_4$ as electrolyte the cell has a cathode (not to be confused with the magnetron cathode) and an anode. The cathode is the deposition electrode. The anode is a permeable membrane containing Copper lumps. A Dynatronix DC power supply provides constant current with forward bias time of as much as several minutes and a reverse bias time of as much as half the forward bias (deposition) cycle. This cycle is repeated continuously throughout the deposition process with approximately the same current, in the range of as much as 25 $A/dm^2$, being applied in the forward and reverse directions. A columnar microstructure deposit is formed at the cathode and removed for target manufacture.

The XRD pole figure technique is used to characterize the polycrystalline material produced by electrochemical deposition. The surfaces of the material are then prepared prior to assembly into a sputter target. In particular, the ECD sample was chemically etched with nitric acid solution. A final surface finish may be necessary after target manufacture to produce the desired surface characteristics.

Examples 13a and 13b collect data for respective plane section, directional arrival profiles of positive copper ions produced from Argon sputtering of the copper polycrystalline target. The target has an average grain size of approximately 17 microns and an MRD of 52.

Figure 13A:
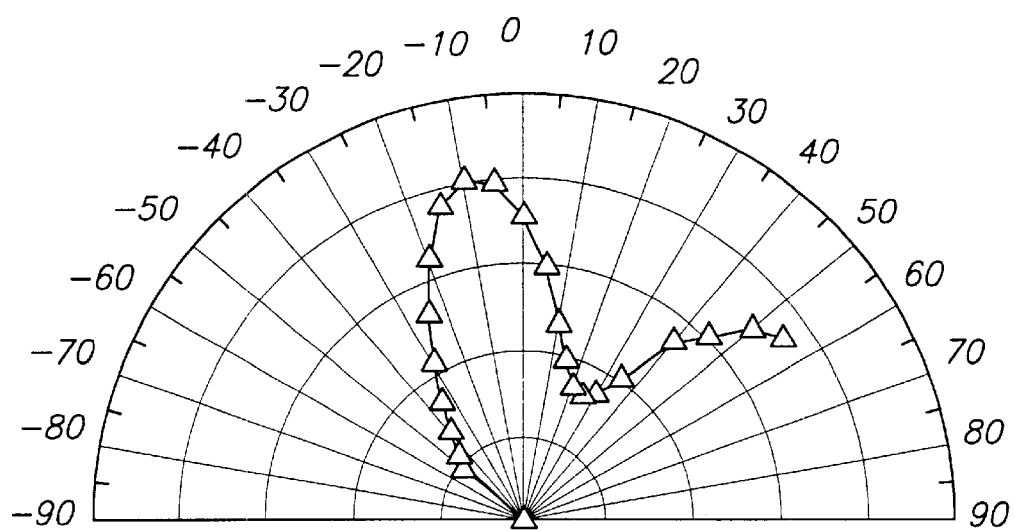

Example 13a employs a nominal power density of 1.5 W/sq. cm. In the examples, the nominal power density assumes a nominal projected racetrack area for comparative purposes. The data is shown by FIG. 13A. The intensity ratio of high angle to low angle arrival (emission) peak is 49.3%. Also in the Examples 13a–15, measurements correspond to the region of maximum sputter flux emission over the racetrack cross-section.

Figure 13B:
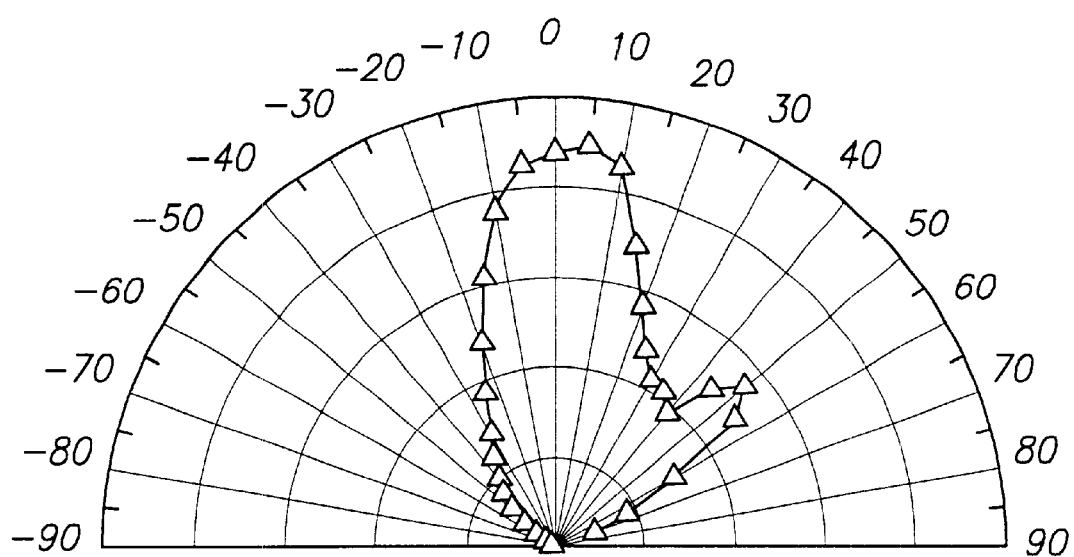
FIG. 13B shows a plane section, directional arrival profile of positive Copper ions produced from Argon sputtering of a Copper (110) polycrystalline sample in Example 13b.

Example 13b employs a nominal power density of 20.0 W/sq. cm. The data is shown by FIG. 13B. The intensity ratio of high angle to low angle arrival (emission) peak is 26.1%.

Examples 14a, 14b and 14c show the reversible nature of the high angle emission/arrival component through variation of applied power to a magnetron cathode. The high angle arrival (emission) component always being of reduced intensity at higher applied powers. The copper target material was a (110) oriented single crystal material. In particular, it was a crystallographically textured copper target material grown through a proprietary technique. In contrast to Example 9, a different cathode was used in Examples 14a, 14b and 14c.

The sample was 2000 Catalogue number CU002120 material from Goodfellow Metals, UK supplied polished. The crystallographic orientation of the crystals formed in the technique for single crystal target manufacture or single crystal mosaic target manufacture is determined through use of XRD pole figures.

Examples 14a, 14b and 14c respectively collect data for a plane section, directional arrival profile of positive copper ions produced from Argon sputtering of the copper crystalline target.

Figure 14A:
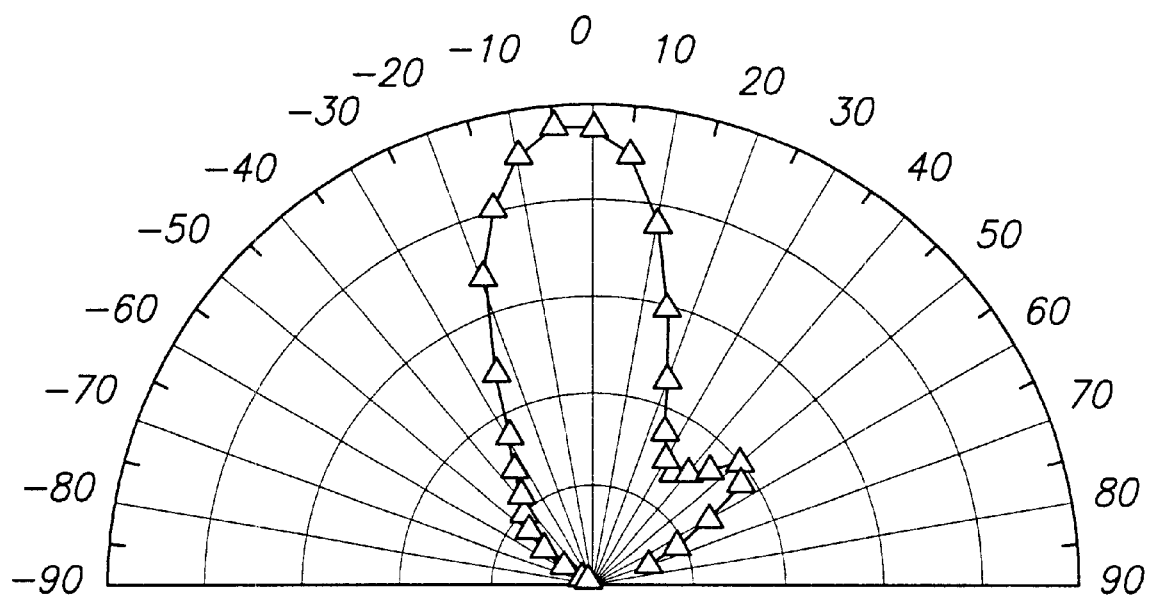

Example 14a employs a nominal power density of 20.0 W/sq. cm. The data is shown by FIG. 14A. The intensity ratio of high angle to low angle arrival (emission) peak is 23.4%.

Figure 14B:
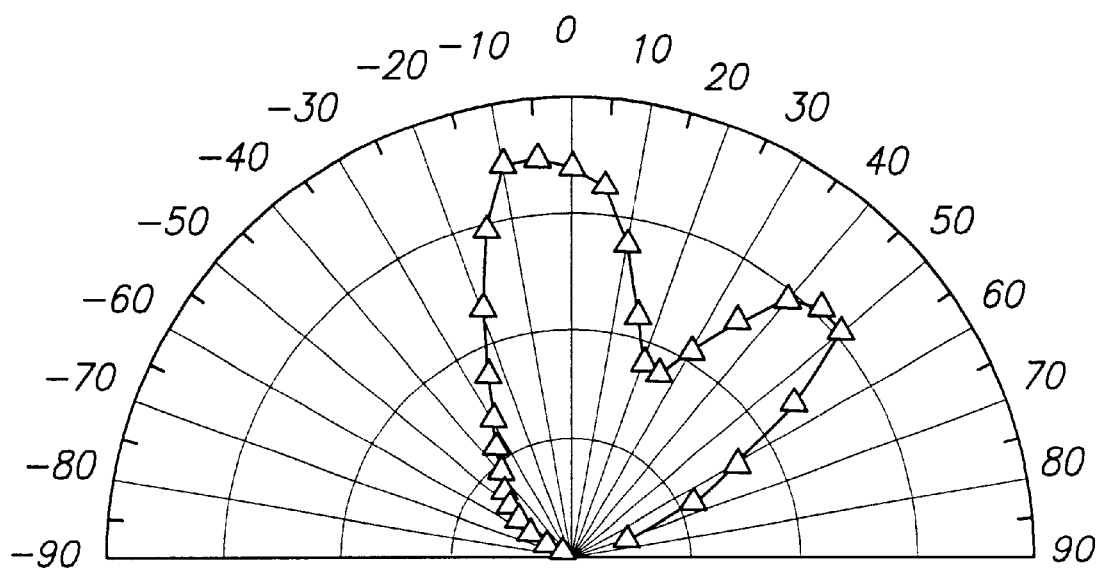
FIG. 14B shows a plane section, directional arrival profile of positive Copper ions produced from Argon sputtering of a Copper (110) single crystal in Example 14b.

Example 14b employs a nominal power density of 1.5 W/sq. cm. The data is shown by FIG. 14B. The intensity ratio of high angle to low angle arrival (emission) peak is 62.2%.

Figure 14C:
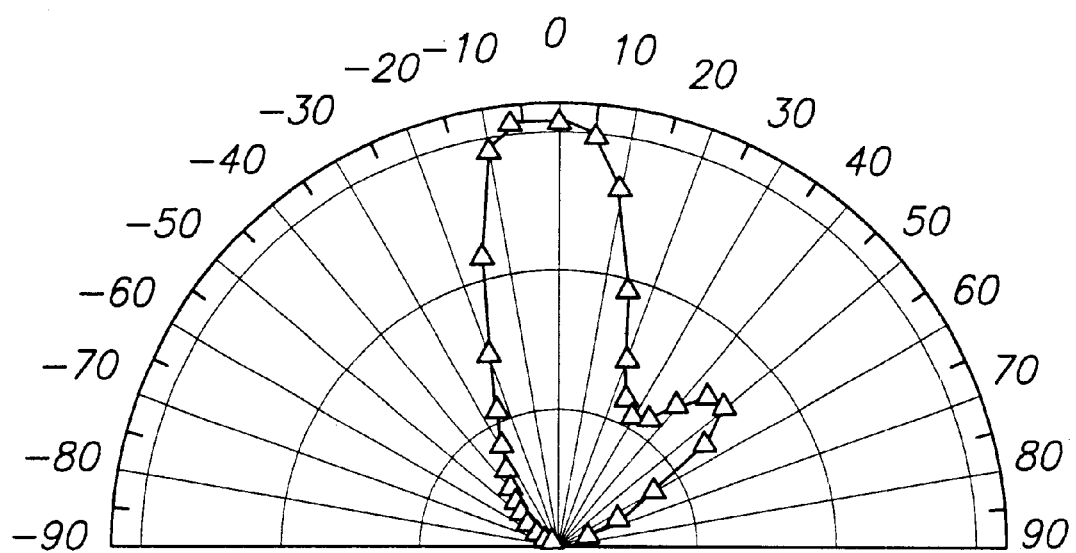
FIG. 14C shows a plane section, directional arrival profile of positive Copper ions produced from Argon sputtering of a Copper (110) single crystal in Example 14c.

Example 14c employs a nominal power density of 10.0 W/sq. cm. The data is shown by FIG. 14C. The intensity ratio of high angle to low angle arrival (emission) peak is 29.1%.

Example 15 shows low intensity high angle sputter arrival (emission) for a (110) textured copper target. The target material was a (110) oriented single crystal material. In particular, it was a crystallographically textured copper target material made by a directional solidification technique.

The directional solidification technique employs a Vacuum Induction Melter (VIM) that utilizes two sets of heating elements and Thermocouples (T/Cs) that are stacked vertically to heat the crucible. Monitoring of the temperature is done with these two T/Cs and a Pyrometer. During the melting phase of the process both sets of heating coils are used. During the cooling phase only the top set is used. This forces the crucible and copper to cool from the bottom ideally allowing one large grain to grow, although typically a few large grains can form.

The process was as follows:
1. The VIM is loaded with 20–23 kg of six nines copper.
2. Vacuum is applied over the crucible to approximately 200 mtorr, chamber backfilled with Nitrogen, held for 20 minutes, and vacuumed again to 200 mtorr.
3. Temperature is ramped to above the melting point of copper, around 1300–1350° C. on the Upper T/C, and 1100–1150° C. on the Lower T/C. The Pyrometer reading at this point is low, 950–1000° C. because the copper had not melted completely. As the copper melts, the reading on the T/Cs will drop as the heat was being transferred to the copper. Monitoring the T/Cs showed that the temperature dropped by 200–250° C. and then began to rise.
4. When the temperature rose to 1300–1350° C. on the pyrometer (1350–1400° C. on the upper T/C and 1200–1250° C. on the bottom T/C) the temperature was ramped down at 150–155° C./hr to about 1000° C. on the pyrometer (1025–1075° C. on the top T/C and 950–975° C. on the bottom T/C). During the cooling stage only the top heating coil is used, the bottom heating coil is not energized.
5. The heat was turned off and the sample allowed to cool to room temperature.

The crystallographic orientation of the grain or grains formed in the directional solidification techniques for single crystal target manufacture or single crystal mosaic target manufacture was determined through use of XRD pole figures. This also facilitated, a sawing process in which suitably orientated sections of crystal were cut from the cast ingot or boule. In particular, directional solidification samples were sawed to expose the (110) material such that the <110> direction is normal to the surface. The surfaces of the material were then prepared prior to assembly into a sputter target. In particular, directional solidification samples were chemomechanically polished with a series of successively finer grits in a fluid medium, and chemically etched with nitric acid solution. A final surface finish may be employed after target manufacture to produce the desired surface characteristics.

Figure 15:
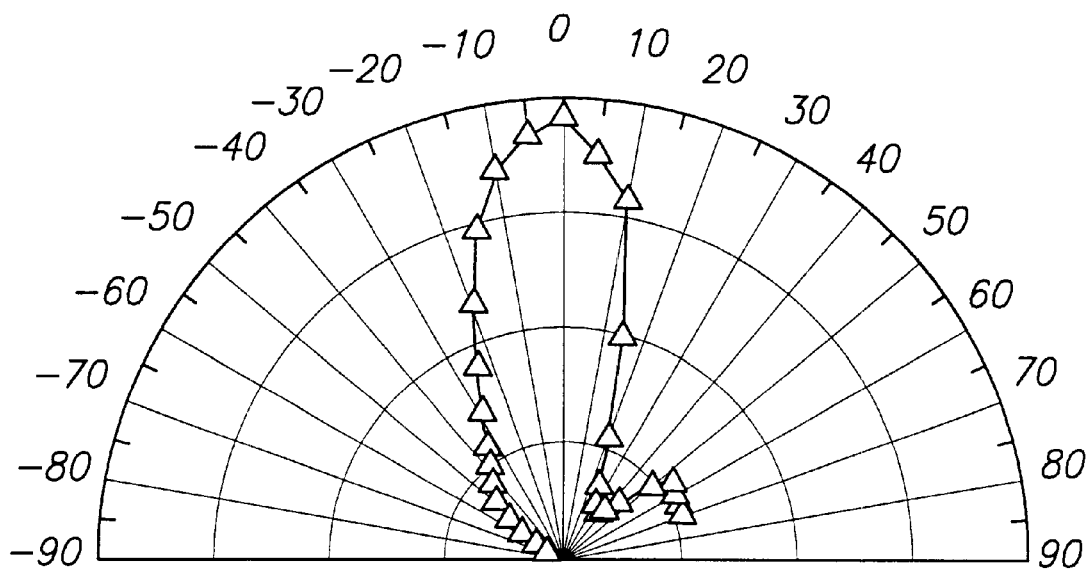
FIG. 15 shows a plane section, directional arrival profile of positive Copper ions produced from Argon sputtering of a Copper (110) single crystal in Example 15.

Example 15 respectively collects data for a plane section, directional arrival profile of positive copper ions produced from Argon sputtering of the copper crystalline target. Example 15 employs a nominal power density of 20.0 W/sq. cm. FIG. 15 shows the data for Example 15. The intensity ratio of high angle to low angle arrival (emission) peak is 19.9%.

Example 16 is a measurement of a racetrack emission intensity profile across the racetrack cross-section for a uniform (110) copper single crystal target made by Goodfellow, UK as discussed above. Since the target is a uniform single crystal, the emission profile shown is a reasonable reflection of the corresponding sputtering Argon ion local area density variation over the racetrack cross-section.

Examples 17a, 17b, 17c and 18 employ a linear scanning magnetron cathode device having the structure of the device shown by FIG. 17 to deposit thin, conformal films of copper. The target was a two piece, 4 inch diameter (110) Copper mosaic structure, produced by the directional solidification technique described above, set into a non-directional Copper target surround. Shielding was used to avoid deposition from the non-directional regions of the target. A PFP of 5 cm and Argon sputtering pressure of $1.1 \times 10^{-3}$ mb were used. 1 KW of dc power was applied to the target. To test the ability of the scanning magnetron technique to maintain directionality, approximately 2.5 mm of target thickness was sputtered from the target prior to consecutive deposition of the examples shown. No macroracetrack groove was produced over the mosaic target structure, indicating uniform erosion.

Crossectional views of via structures were used to determine step coverage. The micrographs were derived through scanning electron microscopy of crossections produced by mechanical cleaving. Films were deposited onto a via patterned silicon dioxide layers on a silicon wafer. The vias were cylindrical of aperture 0.35 microns and aspect ratio of 3. Note that depositions were carried out in a normal laboratory ambient. Therefore nucleation effects and other film defects can arise from contamination from the ambient. Mechanical cleaving can also result in non-uniform cross-sectioning. The examples herein are intended to illustrate the effects of a directionally arriving depositing flux in terms of film thickness distribution. They are not intended to illustrate optimum film quality.

Example 17a shows conformal coverage produced by the DAPVD technique over a 1 micron aperture, taped via structure. A basal step coverage of approximately 85% and sidewall step coverage of approximately 50% is demonstrated. FIG. 21 shows the step coverage resulting from Example 17a.

Example 17b shows conformal coverage produced by the DAPVD technique over a 0.35 micron aperture, via structure of aspect ratio 3. A basal step coverage of approximately 45% and sidewall step coverage of approximately 30% is demonstrated. FIG. 22 shows the step coverage resulting from Example 17b.

Figure 23:
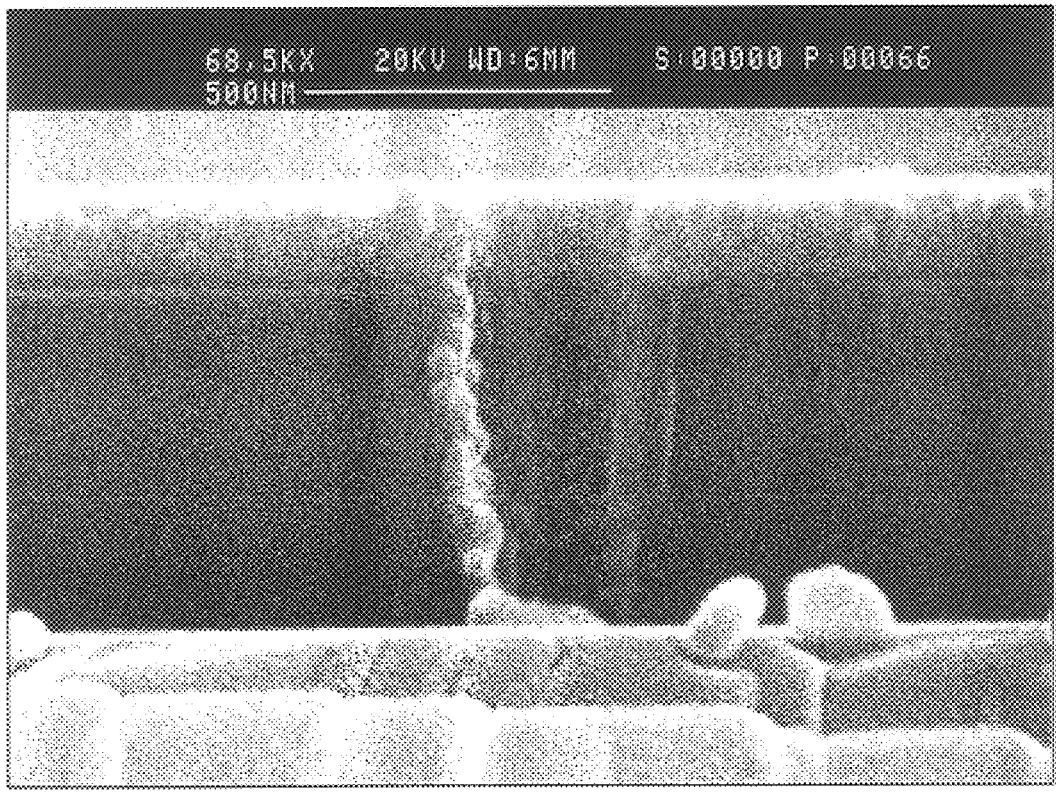

Example 17c another via from the sample of Example 17b demonstrating the consistency in the step coverage produced. Note the almost normal orientation of the columnar grains forming the top film and via basal film that strongly indicates the near normal incidence of depositing particles. The portion of the via described by the plane PQRS in the figure is at normal incidence to the SEM axis. FIG. 23 shows the step coverage resulting from Example 17c.

Example 18 shows conformal Copper coverage produced in a sputter run consecutive to Example 17. This further illustrates continuity of directional emission by the DAPVD technique. FIG. 24 shows the step coverage resulting from Example 18.

While there have been shown and described what are at present considered the preferred embodiments of the present invention, it will be clear to those skilled in the art that various changes and modifications may be made therein without departing from the scope of the invention as defined by the appended claims.

We claim:

1. A sputtering target comprising a backing plate and a mosaic of a plurality of platelets of single crystals having crystallographic orientations and being positioned on the backing plate; the platelets comprising primarily copper or aluminum; and wherein individual platelets of the plurality of platelets of single crystals have different crystallographic orientations relative to one another.

2. The sputtering target of claim 1 wherein the platelets primarily comprise copper.

3. The sputtering target of claim 1 wherein the platelets primarily comprise aluminum.

4. The sputtering target of claim 1 wherein the platelets comprise both copper and aluminum.

* * * * *

UNITED STATES PATENT AND TRADEMARK OFFICE
CERTIFICATE OF CORRECTION

PATENT NO. : 6,585,870 B1
DATED : July 1, 2003
INVENTOR(S) : Philip George Pitcher et al.

It is certified that error appears in the above-identified patent and that said Letters Patent is hereby corrected as shown below:

<u>Title page,</u>
Item [56], References Cited, FOREIGN PATENT DOCUMENTS, please delete "211758" and insert -- 2011758 --; delete "0551774" and insert -- 5051774 --; delete "0729896" and insert -- 7029896 --; and delete "0878189" and insert -- 8078189 --.

<u>Column 3,</u>
Line 35, please delete "referred" after "However," and insert -- preferred --.
Line 41, please delete "The" after "sputtering" and insert -- the --.

<u>Column 11,</u>
Line 11, please delete "α" after "α and" and insert -- ά --.

<u>Column 14,</u>
Line 55, please delete "the as" after "generally" and insert -- as the --.

<u>Column 21,</u>
Line 8, please insert -- ) -- after "1992".
Line 65, please delete "of the thickness" before "of".

<u>Column 25,</u>
Line 1, please delete "fom" after "hemisphere" and insert -- from --.

Signed and Sealed this

Third Day of February, 2004

JON W. DUDAS
*Acting Director of the United States Patent and Trademark Office*